United States Patent [19]

Chow et al.

[11] 4,435,754
[45] Mar. 6, 1984

[54] METHOD OF SELECTING PROM DATA FOR SELECTIVE MAPPING SYSTEM

[75] Inventors: Yiu T. Chow, Kowloon, Hong Kong; Thomas J. Gilligan, Rolling Hills Estates, Calif.

[73] Assignee: Ampex Corporation, Redwood City, Calif.

[21] Appl. No.: 279,234

[22] Filed: Jun. 30, 1981

[51] Int. Cl.³ .............................................. G06F 11/00
[52] U.S. Cl. ...................................... 364/200; 371/8; 371/10
[58] Field of Search ............... 364/200, 300, 400, 900; 365/200; 371/8, 10, 11

[56] References Cited

U.S. PATENT DOCUMENTS

| | | | |
|---|---|---|---|
| 3,952,184 | 4/1976 | Bassard | 364/300 |
| 4,028,539 | 6/1977 | Jacobs et al. | 371/10 |
| 4,051,354 | 9/1977 | Choate | 371/10 |
| 4,051,460 | 9/1977 | Yamada et al. | 371/10 |
| 4,193,115 | 3/1980 | Albus | 364/300 |
| 4,250,562 | 2/1981 | Haag et al. | 364/900 |
| 4,310,901 | 1/1982 | Harding et al. | 365/200 |
| 4,328,542 | 5/1982 | Anastas et al. | 364/200 |

*Primary Examiner*—Jerry Smith
*Assistant Examiner*—Jameson Lee

*Attorney, Agent, or Firm*—Joel D. Talcott; Gregory L. Roth

[57] ABSTRACT

A program for determining the data for translation and key PROMs in a mapping system maps an A group of input states into an AK X AT A map and a B group of input states into a BK X BT B map. The smaller B group is mapped first with even packing in which the number of mapped elements assigned each BT state is maintained approximately equal as mapped elements are assigned BT locations. The larger A group is mapped last with close packing in which mapped elements are assigned preferentially to the AT state with the most previously mapped elements. The A group and B group are each ordered according to the number of mapped elements associated therewith from most to least and mapped in sequential order if possible. Further, the probability of successfully assigning all elements to be mapped is optimized by sequentially ordering the BT states according to number of vacancies available to receive mapping states from most to least, assigning next mapping states preferentially according to the order, and then updating the order to reflect the assignment. The AT states are sequentially ordered according to number of vacancies available to receive mapping states from least to most, next mapping states are assigned according to the order, and then the order of the AT states is updated to reflect the assignment.

13 Claims, 10 Drawing Figures

FIG.9

| A KEY DATA | | 0 | 1 | 2 | 3 | 4 | 5 -------63 |
|---|---|---|---|---|---|---|---|
| 15 | | | | | | | |
| 14 | | | | | | | |
| 13 | | | | | | | |
| 12 | | | | | | | |
| 11 | | | | | | | |
| 10 | | | | | | | |
| 9 | | A0　　0 | | | | | |
| 8 | | A17　　1<br>B27 | | | | | |
| 7 | | A16　　1<br>B17 | | | | | |
| 6 | | A14　　1<br>B5 | | | | | |
| 5 | | A13　　1<br>B10 | | | | | |
| 4 | | A10　　1<br>B11 | | | | | |
| 3 | | A5　　1<br>B26 | A23　　1<br>B11 | A20　　1<br>B6 | | | |
| 2 | | A36　　2<br>B15,23 | A18　　1<br>B27 | A19　　1<br>B27 | | | |
| 1 | | A35　　3<br>B4,6,18 | A6　　1<br>B6 | A4　　2<br>B4,11 | A25　　2<br>B4,7 | | |
| 0 | | A27　　4<br>B19,20,21,22 | A30　　4<br>B4,17,18,19 | A29　　3<br>B17,18,19 | A31　　3<br>B17,18,19 | | |

A TRANSLATION DATA

METHOD OF SELECTING PROM DATA FOR SELECTIVE MAPPING SYSTEM

CROSS REFERENCE TO RELATED APPLICATION

This application is related to "SELECTIVE MAPPING SYSTEM AND METHOD," by Thomas J. Gilligan, Ser. No. 279,204, filed June 30, 1981.

BACKGROUND OF THE INVENTION

1. Field of the Invention

This invention relates to a method or program for assigning data to translation control stores in a mapping system.

2. Discussion of the Prior Art

An advantageous mapping system separates input codes defining input elements of a first set into an A input group and a B input group orthogonal to the A group. Each group is in turn mapped into a K by T map in which the T or translation state partially defines the output mapping state of each mapped element. All of the T states in combination uniquely define the output mapping state. The K or key states in turn uniquely identify each of the elements within an input group which have been assigned to a given T state. A relationship detector in the form of a fault store is addressed by the T states and at each address location stores the key states corresponding to that address. A comparator receives the outputs of the fault store and key stores storing the assigned K states and upon the occurrence of a match indicating that a T code combination corresponds to a current input state of the first set outputs a command causing the current input state to be mapped to an element of a second set defined by the T codes that are generated.

However, the number of mapped states associated with an input code of a first input group cannot exceed the number of T codes associated with the second group. Also, the total number of mapped states assigned to a given T code state of a first group cannot exceed the number of T code states of the second group and once an input group state having given mapped states associated therewith is assigned to a particular T state, another input group state cannot be assigned to the same T state if it has any mapped state in common with a mapped state of an input group state previously assigned to the particular T state.

These restrictions limit the assignment of input group states to K and T codes and hence the utilization of the maximum capacity of a mapping system. For example, in a mapping system with a capacity of 4096 mapped states, the restrictions may prevent the actual mapping of more than 3500 states. The present methods of assigning K and T codes to input group code states helps optimize the probability that a given number of mapped states can be accommodated by a given capacity mapping system.

SUMMARY OF THE INVENTION

A mapping system divides encoded input signals identifying elements in a first set, some of which are mapped states which are to be mapped by the system, into an A group and a B group orthogonal thereto. The A group of input signals selects a particular A group superstate from a plurality of A group superstates while the B group of input signals selects a particular B group superstate from a plurality of B group superstates. A and B stores provided for the A and B group respectively output key (K) codes and translation (T) codes upon being accessed by a group of input signals. The A store and B store T code signals define in combination a state or element within a second set to which selected elements of the first set are to be mapped. The K codes identify a particular element in the first set which is to be mapped to a particular element of the second set.

A program in accordance with the invention for assigning K and T codes to the A and B store address locations includes the steps of assigning a B group of input states, each having mapped states associated therewith, to a BK by BT B map in even packing order by maintaining the number of mapped states associated with the input states assigned to each BT state approximately equal; and assigning an A group of input states, each having mapped states associated therewith, to an AK by AT A map in close packing order by maximizing the number of mapped states associated with the input states assigned to the AT state having the most mapped states associated with the input states previously assigned thereto. The input states of the A and B groups are each assigned in sequential order of the number of mapped states associated therewith from most to least. The BT states are arranged in sequential order of the number of available mapped states from most to least and the order is updated after each new assignment of a B input state to the B map. Input states are assigned preferentially to the highest permissible BT state in the sequential order. The AT states are arranged in sequential order of the number of available mapped states from least to most and the order is updated after each new assignment of an A input state to the A map. A input states are assigned preferentially to the highest permissible AT state in the sequential order.

In an alternative program the input states of the A group are first assigned to the A map with even packing and then the input states of the B group are assigned to the B map with even packing. In still another program the input states of the B group are first assigned to the B map and then the input states of the A group are assigned to the A map, both assignments being made with even packing.

Once the input groups are assigned to the A and B maps, the input group states represent the respective A and B address states while the K and T map states corresponding thereto represent the data stored at the corresponding address states.

BRIEF DESCRIPTION OF THE DRAWINGS

A better understanding of the invention may be had from a consideration of the following detailed description taken in conjunction with the accompanying drawings in which:

FIG. 9 is a two dimension A Key Data and A Translation Data map for the example in accordance with the invention.

DETAILED DESCRIPTION

Figure 1:
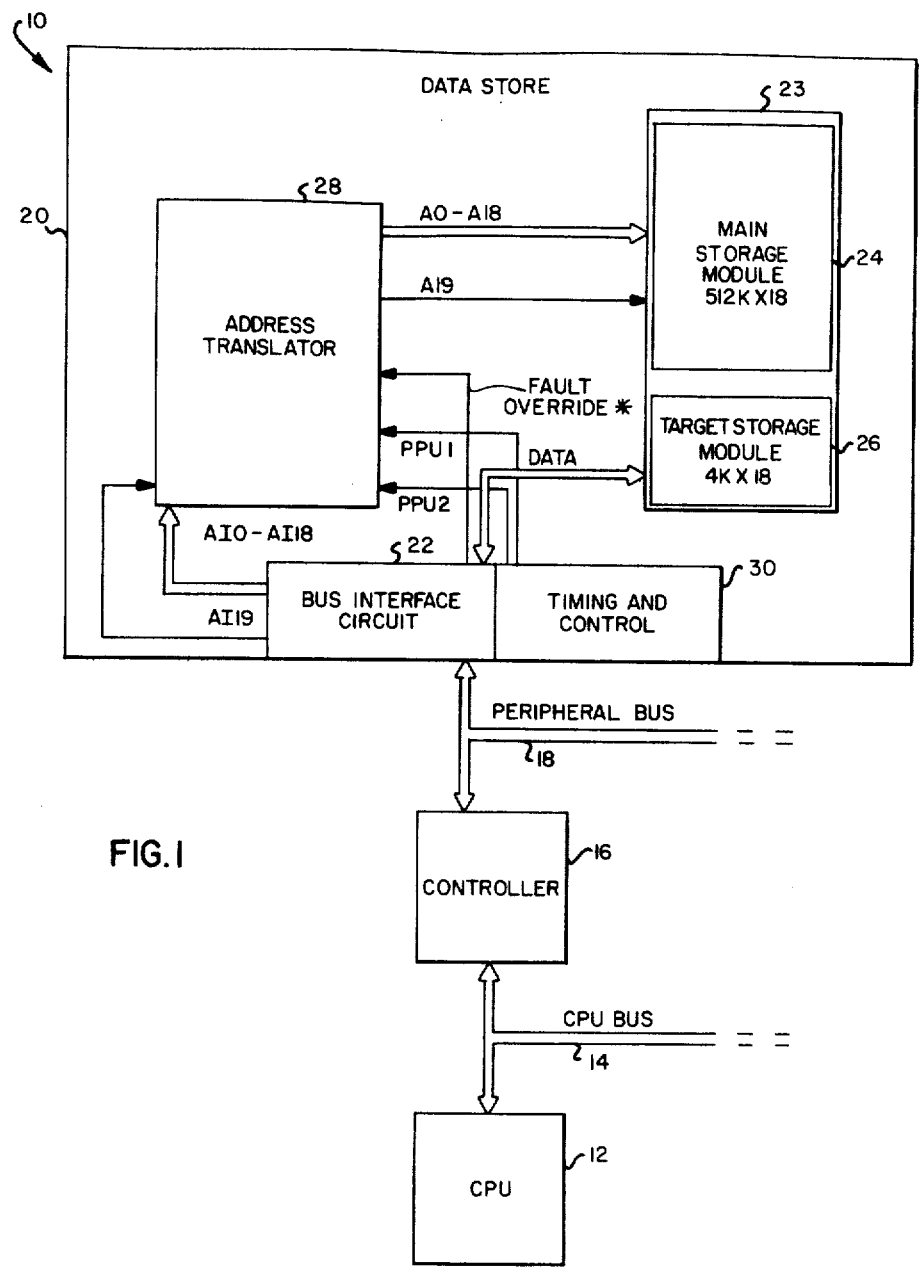
FIG. 1 is a block diagram of a data processing system utilizing a data store with an address translator in accordance with the invention.

Referring now to FIG. 1, a data processing system 10 in accordance with the invention includes a central processing unit 12 connected by a CPU bus 14 to a controller 16. The controller 16 is in turn connected by a peripheral bus 18 to a data store 20. In a conventional manner the CPU bus 14 may also connect to additional controllers or peripheral devices, I/O devices, on memory units. Similarly, the peripheral bus 18 may conventionally connect to other data storage units such as a disk drive or other data store such as the data store 20.

In general, the data store 20 need not be connected through a controller to the CPU bus but could be connected directly to the CPU bus or could otherwise be connected directly to CPU 12 or through a cache memory to CPU 12. However, the address translation feature of the present invention is particularly advantageous for use with a very large data store such as a large core memory manufactured by Ampex Corporation and sold under the trademark "MEGASTORE" for use as a head per track disk replacement or substitute. When so used, the data store 20 is coupled through a peripheral bus such as bus 18 to a disk drive controller such as controller 16. The data store then includes a bus interface circuit 22 which particularly adapts the data store 20 to connection to the particular configuration and signal requirements of the peripheral bus 18. Advantageous embodiments of the data store 20 are described in U.S. Pat. No. 4,238,838 and in U.S. Pat. No. 4,096,583 which has been reissued as U.S. Pat. No. Re. 30,395. A further improvement has been described in application Ser. No. 269,474, filed June 2, 1981 for "RUGGED, VIBRATION RESISTANT MAGNETIC CORE STACK HAVING LOW MASS" by Thomas J. Gilligan.

The data store 10 further includes a bus interface 22, a data storage module 23 having a 512K word by 18 bit main storage module 24 and a 4K word by 18 bit target storage module 26, an address translator 28, and timing and control circuitry 30. The main and target storage modules 24, 26 are advantageously manufactured as a single core memory or other form of data store with a 20th address line A19 causing the selection of address locations within main storage module 24 when at logic 0 and the selection of address locations within the target storage module portion 26 when at logic 1. The main storage module portion 24 of data storage module 23 responds to 19 binary encoded address inputs designated A0-A18 to select one of the 512K words in response to a memory access. Similarly, when address input A19 causes the selection of target storage module portion 26 of data storage module 23, address inputs A0-A18 cause the selection of one of 4K words within target storage module 26. It will be appreciated that address bits A12-A18 are forced false and that only the least significant 12 address inputs A0-A11 plus A19 are effective in the addressing of target storage module 26 since this is all that is required to select one word out of 4K words. The data storage module 23 and timing and control circuitry 30 are generally conventional in nature and respond to signals from peripheral bus 18 communicated through the interface circuit 22 to perform data storage and retrieval operations at address locations indicated by address data bits A0-A19.

Bus interface circuit 22 is conventional in nature and in particular will depend upon the configuration of peripheral bus 18. It operates to provide the necessary signal and timing relationships to meet the bus protocol required for communication on peripheral bus 18 and also to communicate data store access signals received over peripheral bus 18 to appropriate portions of data store 20.

In normal operation data store 20 appears to controller 16 as a 512K by 18 bit data store which is randomly accessible in response to 19 input address bits AI0-AI18. Address translator 28 receives these 19 input address bits or signals and in response thereto outputs 20 memory address bits A0-A19. Most of the time address translator 28 merely operates to convert input addresses AI0-AI18 into corresponding memory addresses A0-A18 with address line A19 at logic 0 to address an indicated word within main storage module 24. However, address translator 28 is arranged to cause the diversion of addresses identifying selected locations within main storage module 24 to addresses identifying corresponding translated address locations within target storage module 26, with address output line A19 at logic 1 to indicate the selection of target storage module 26.

The address translator 28 is thus advantageously utilized to divert addresses selecting a defective word location within main storage module portion 24 to a corresponding nondefective word location within target storage module 26. The correspondence between defective locations within main storage module 24 and nondefective locations within target storage module 26 is preestablished in address translator 28 with the translation being transparent to controller 16 and CPU 12. That is, as far as controller 16 is aware it has sent to data storage 20 an address for a location within main storage module 24 with the corresponding data being accessed. Controller 16 is unaware that the actual address has been diverted or translated to an operable storage location within target storage module 26.

Although the data store 20 responds to only 19 input address lines AI0-AI18 under normal operation, the 20th input address line AI19 corresponding to output line A19 is also connected to bus interface circuit 22 so that it may be driven by an external device. This 20th input address line and the signal thereon is utilized primarily in conjunction with a fault override* (*indicates a logically inverted signal level) signal which is also presented to external components through bus interface circuit 22 to permit the selective addressing of all addresses within data storage module 23. That is, with the fault override* signal at logic 0 the address translator 28 is effectively overridden to produce a direct correspondence between address inputs AI0–AI19 and A0–A19. Data storage module 23 thus appears as a 516K word by 18 bit memory any of the words therein being addressable by the 20 address bits. During the testing phase it thus becomes possible for every word of the data storage module 23 to be written and read for testing purposes without the address translator 28 introducing an uncertainty as to exactly which word location within data storage module 23 is being accessed. Defective word locations within main storage module 24 can thus be logged along with defective word locations that might occur within target storage module 26. This unambiguous detection of defective word locations thus permits address translator 28 to be arranged to translate addresses for defective word locations within main storage module 24 into valid address word locations within target storage module 26 while avoiding defective address word locations within target storage module 26.

The data storage module 23 may be tested in a conventional manner to detect and log defective word locations as well as to establish optimum drive current and sense amplifier threshold operating points and margins therefor. Once the data store 20 is tuned or set to the optimum operating conditions, all defective word locations are noted or logged for use in arranging address translator 28 to divert addresses for defective word locations within main storage module 24 to addresses for valid word locations within target storage module 26.

In one specific example utilizing 9 mil ungraded cores with no rework after wiring, it was found that the optimum nominal threshold was 3.05 millivolts with Y read current set at 180 milliamps and all other drive currents at 200 milliamps. With the sensing threshold margins established between 2.2 millivolts and 3.9 millivolts there were approximately 2262 defective word locations within main storage module 24 which required translation or mapping into valid word locations within target storage module 26. That is, as the actual sensing threshold was varied between the upper and lower margins there were 2262 addresses at which either a 1 was stored and read back as a 0 or a 0 was stored and read back as a 1 under worst case pattern conditions. It naturally happens that as the lower margin is decreased or as the upper margin is increased additional storage locations fail to operate properly. The present example was found to present an acceptable compromise between a reasonable number of errors and adequate operating margins to accommodate aging, temperature changes, and other factors which might affect operation of the memory.

Two power up PROM enable signals PPU 1 and PPU2 are generated by timing and control circuit 30 in response to a conventional module select signal which indicates the addressing of the particular main storage module 24. These signals are peripheral to the actual operation of address translator 28 and merely enable it during periods that it is actually receiving and translating or passing through input addresses and disable PROMs within address translator 28 when not actually being used in order to reduce power consumption. At the expense of greater power consumption the PROMs could be continuously enabled with the signals PPU1 and PPU2 being eliminated.

Figure 2:
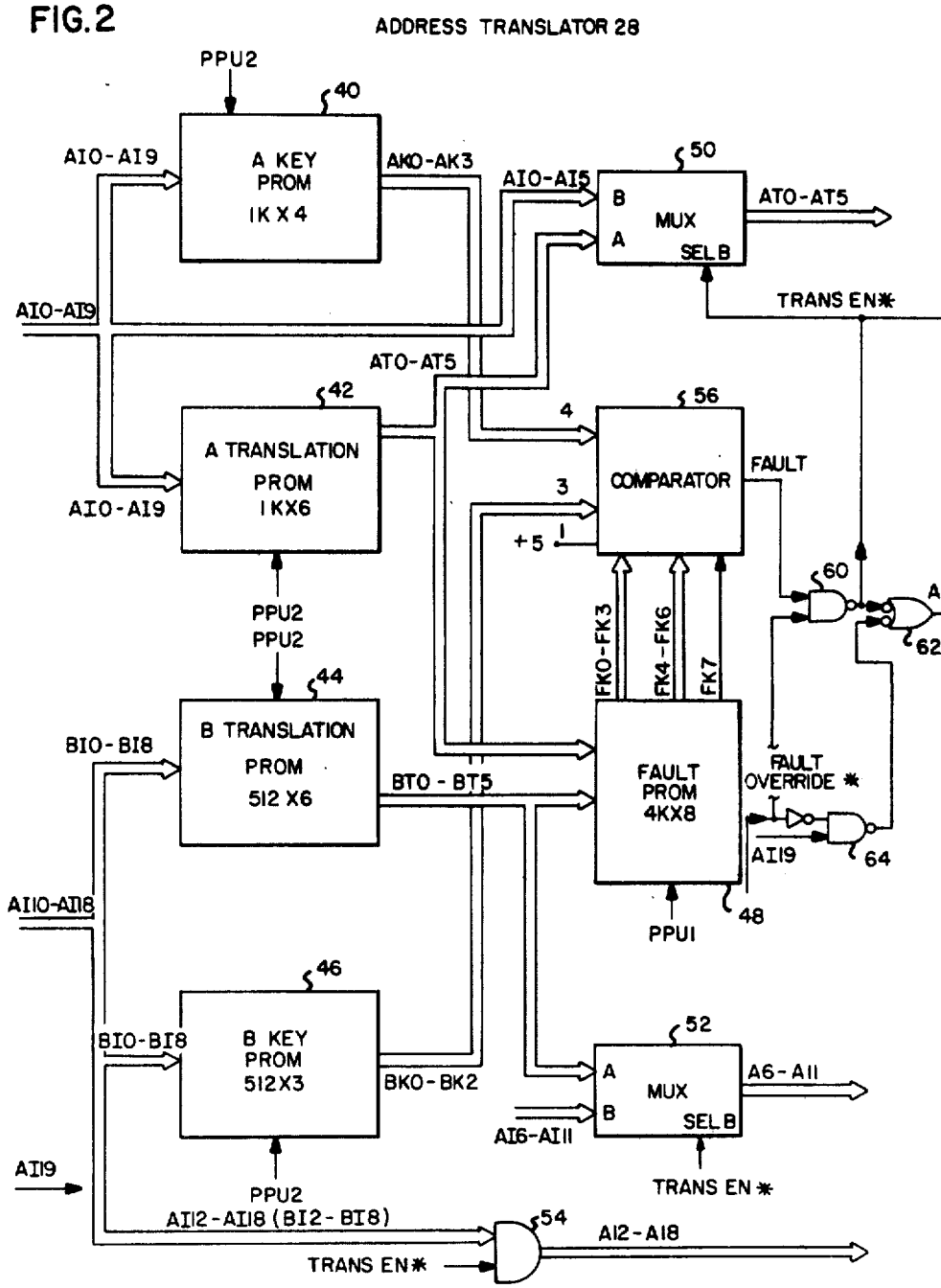
FIG. 2 is a schematic representation of a selective mapping system in accordance with the invention implemented as a memory address translator.

Referring now to FIG. 2, the address translator 28 includes a 1K word by 4 bit A key PROM 40, a 1K word by 6 A translation PROM 42, a 512 word by 6 bit B translation PROM 44, a 512 word by 3 bit B key PROM 46, and a 4K word by 8 bit fault PROM 48. These PROMs 40–48 store the data required to detect the occurrence of an incoming address for a defective word location in main storage module 24 as well as the data for translating the address to an address for a valid word location within target storage module 26. Since the data is unique for each data store 20 and must be retained throughout the operating life of the data store 20, PROMs provide a convenient and relatively inexpensive apparatus for receiving and permanently retaining this data. It will be appreciated that subject to cost or system application considerations other forms of data storage such as E-PROM, ROM and RAM could be substituted for the PROMs 40–48. In the event that a volatile type of storage is used, it will be apparent that it will be necessary to provide a means of preserving the data during times of shutdown for data store 20 or of writing the required data into the PROM substitutes as part of an initialization procedure upon reactivating data store 20 following a shutdown. This problem is of course avoided by utilizing the permanent, nonvolatile storage characteristics of a PROM.

A first multiplexer 50 receives the least significant input address signals AI0–AI5 at its B input and the six translated address output data bits of PROM 42, AT0–AT5 at its A input. Similarly, multiplexer 52 receives the six input address signals AI6–AI11 at its B input and the six output translated address data bits from translation PROM 44 at its A input. A translate command signal TRANSEN* is normally high to drive the select B inputs of multiplexers 50 and 52 to cause the incoming address signals AI0–AI5 to be output as memory address signals A0–A5 and to cause the incoming address signals AI6–AI11 to be output as memory address signals A6–A11. Upon the occurrence of an active low translate enable signal TRANSEN*, the A inputs of multiplexers 50, 52 are activated to cause the data stored by A translation PROM 42 to drive the least significant memory address bits A0–A5 and to cause the data stored by B translation PROM 44 to drive the memory address bits A6–A11. A multiple input AND gate 54 receives address input signals AI12–AI18 and outputs them as A12–A18 in response to a logic 1 state of signal TRANSEN*, which occurs when no translation is to take place. Consequently, in the absence of a translation, input address signals AI12–AI18 are passed through as memory address signals A12–A18 corresponding thereto and in the event that an address is being translated the translated addresses A12–A18 are output at logic 0. These logic 0 address bits, in conjunction with address bit A19, properly point to the 4K word target storage module 26 and only the lowest order 12 bits are required to identify a word location within module 26.

It can thus be seen that in the event that an address translation is to occur, the six data bits output by A translation PROM 42 and the six data bits output by B translation PROM 44 combine to form the 12 memory address bits A0–A11 required to select a designated word location within target storage module 26. Simultaneously, these 12 address bits are communicated as address inputs to fault PROM 48 to select one of 4K word locations within fault PROM 48. Each word within fault PROM 48 thus corresponds on a 1 to 1 basis with a word within target storage module 26. The 8 bits of an addressed data word within fault PROM 48 are communicated to one set of inputs of a comparator 56 with four bits designated FK0–FK3 being compared to the four data bits designated AK0–AK3 output by A key PROM 40, with three data bits designated FK4–FK6 being compared to three data bits designated BK0–BK2 output by B key PROM 46 and with the eighth data bit designated FK7 being compared to a logic 1 voltage level of +5 V. Upon the occurrence of an identity among the eight pairs of data bits, comparator 56 generates an output designated Fault which indicates that the incoming address has selected a defective location within main storage module 24 and that an address translation is to occur.

Since in any given data store 20, a full 4K defective word locations are not likely to be found within main storage module 24, all 4K word locations within fault PROM 48 and target storage module 26 will not usually be utilized. The eighth bit of fault PROM 48 designated FK7 is thus utilized to indicate whether or not an addressed word location within fault PORM 48 is an address which is actually being utilized for translation. When an address input to fault PROM 48 is one which corresponds to an actual translation word location, the eighth data bit FK7 is set to logic 1 so that it can be successfully compared to the corresponding logic 1 input to comparator 56. This assumes that fault PROM 48 is manufactured with no data or "unburned" data outputs of all 0's. For other types of PROMs which are manufactured with an initial data state of all 1's it would be desirable to change the eighth bit to a 0 to indicate a defective address state so that an affirmative change in the PROM data would be required to indicate a defective address state requiring translation.

Since A translation PROM 42 receives ten binary encoded address bits AI0–AI9 corresponding to 1K words or states and outputs only six binary encoded translated data bits, there are 16 address states (four binary encoded bits) corresponding to each translated address state output by A translation PROM 42. A key PROM 40 receives the ten input addresses and in response generates four binary encoded key data bits which define 16 states to permit the assignment of each of the 16 input addresses corresponding to each translated address state of A translation PROM 42 to one of the 16 states definable by A key PROM 40. Between them, the A key PROM 40 and A translation PROM 42 thus receive ten binary encoded input address bits and output ten binary encoded bits which permit a unique one to one and onto mapping of the 1024 states defined by the input address bits AI0–AI9 to 1024 states defined by the binary encoded output data bits AK0–AK3 and AT0–AT5 of A key PROM 40 and A translation PROM 42.

In a similar manner, the B translation PROM 44 and B key PROM 46 receive 9 binary encoded input address bits AI10–AI18 and provide a unique one to one end onto mapping of 512 states defined by these input address bits to 512 states defined by 9 binary encoded output bits designated BT0–BT5 and BK0–BK2. It will thus be appreciated that the translation PROMs 42-44 provide an address translation from the 19 input addresses AI0–AI18 to 12 output address bits A0–A11. That is, from the set of states defined by input addresses, the subset of states or word locations corresponding to memory defects, is translated or mapped into a second set of states corresponding to word locations within target storage module 26. It will further be apparent that there are 128 input address states (7 bits) for each of the 4K (12 bits) address states within fault PROM 48 and target storage module 26. The A and B key PROMs 40, 46 store 7 bits of key data which permit unique identification of one of the 128 address states corresponding to each combined output of the translation PROMs to be selected as a defective address location and translated to the target storage module 26.

For example, if address 0 is a defective address and is to be translated to the lowest order address within target storage module 26, the A and B translation PROMs 42, 44 would store all 0's at input address words 0 therein. Twelve bits of 0 translated address would thus cause a translation to the lowest order word location within target storage module 26 and also within fault PROM 48. 127 nondefective input address locations would also be assigned to the all 0 translated address state of translation PROMs 42, 44. However, each of these 127 nondefective addresses plus the one defective address would be assigned a unique combination of key data codes amongst the A and B key PROMs 40, 46. The 0 word of fault PROM 48 would then have stored therein the unique combination of seven fault key data bits which match the combination of seven key data bits stored within A and B key PROMs 40, 46 which correspond to the one of 128 input address locations corresponding to translated address state all 0's of the translation PROMs which actually represents a defective storage location. Upon the occurrence of this address, comparator 56 detects a match between all eight pairs of inputs and generates the output signal fault.

This fault signal is coupled as one input to a NAND gate 60 whose output generates the translate command signal TRANSEN* which drives the select B inputs to multiplexers 50 and 52. This signal is also communicated to a NAND gate 62 whose output generates the 20th address signal A19 which determines the selection of either main storage module 24 at logic 0 or target storage module 26 at logic 1.

The FAULT OVERRIDE* signal is received from the bus interface for data store 20 and coupled to selectively disable NAND gate 60 when at logic 0. It is also inverted and coupled to a NAND gate 64 which receives as a second input and input address signal AI19 from the bus interface. The output of NAND gate 64 is coupled as a second input to NAND gate 62 so that upon the occurrence of a logic 0 for signal FAULT OVERRIDE*, the memory address signal A19 is generated in direct correspondence to the input address signal AI19 received at the bus interface circuit 22. It will be apparent that the occurrence of the logic 0 FAULT OVERRIDE* signal will cause the occurrence of a logic 1 TRANSEN* signal which will further cause the memory address bits A0–A13 to be generated in direct correspondence to the incoming address signals AI0–AI18 to permit addressing of all locations within data storage module 23 without interference by address translator 28.

While the address transistor 28 theoretically accommodates 4K errors, there are certain restrictions upon the way in which translation address can be assigned to incoming addresses for defective locations. As a result, the probability of being able to properly assign address translations to accommodate all errors drops significantly when the number of errors exceeds approximately 3500 out of 4096. This results because there are a number of restrictions on the manner in which addresses for defective words within main storage module 24 are translated to addresses for words within target storage module 26. For example, dividing the input addresses AI0–AI9 into an A group and input addresses AI10–AI18 into a B group can be conceptualized as creating a two-dimensional matrix of word locations with the A addresses representing one dimension and the B addresses representing the second dimension. For every A dimension address state there are 9 bits or 512 B dimension address states and the A dimension address states can be thought of as 1024 lines, each representing an A address state, which intersect 512 B dimension lines, each representing a different unique B address state. It is thus possible that there will be up to 512 errors associated with each A dimension address. However, each A dimension address must be assigned a single unique 6 bit translation address by A translation PROM 42 and the multiple defective word locations which may be associated therewith must be uniquely distinguished by assigning each one a different translation address within B translation PROM 44. For example, if 6 defective word locations are associated with a given A dimension address, A translation PROM 42 may store data assigning the translated address of all 0's to that A dimension address. However, each of the associated B dimension addresses which represent defective word locations must be assigned a different B translation address within PROM 44. For example, if the B dimension defective addresses associated with the given A dimension address are 1, 10, 20, 33, 44, and 56, then the corresponding word locations within B translation PROM 44 would be assigned the respective data state 0, 1, 2, 3, 4 and 5. It is thus apparent that even though multiple error locations may be associated with a given A dimension address, that by assigning different data states within B translation PROM 44 to the different associated B dimension addresses, a unique 1 to 1 translation can be made from each incoming address which identifies a defective word location to a translated address within the target storage module 26. However, B translation PROM 44 outputs only 6 bits which define 64 unique states. It is thus possible to accommodate a maximum of 64 defective word locations associated with a given A dimension address line. Furthermore, for each B dimension translated address within B translation PROM 44 there can be associated only 8 different B dimension addresses which are distinguished by the three bits of B key PROM 46. Consequently, as the number of total defective word locations increases toward the maximum capacity of 4096, the probability of having available states within the B PROMs 44 and 46 to accommodate multiple errors associated within a given A dimension address decreases. Similarly, the probability of having available states within the A dimension PROMs 40, 42 to accommodate multiple defective word locations associated with a given A dimension address decreases. A statistical study has indicated that for the arrangement shown in FIG. 2 the probability of being able to accommodate a translation of all defective word locations decreases sharply as the number of defective word locations approaches 3500.

There are a number of restrictions on the assignment of data states to the A and B PROMs 40–46, which effect the accommodation of the theoretical maximum number of errors. These restrictions are that:

1. No more than 64 errors can be associated with each A dimension translate state or corresponding translation address code.

2. No more than 64 errors can be associated with each B dimension translate state or corresponding address code.

3. The assignment of an A dimension address code associated with a defective word location to a translated address within the A PROMs 40, 42 must be a 1 to 1 mapping.

4. The assignment of a B dimension address code associated with a defective word location to a translated address within the B PROMs 44, 46 must be a 1 to 1 mapping.

5. The assignment of translated addresses within the A translation PROM 42 to the A dimension addresses and of the translated addresses within the B translation PROM 44 to B dimension addresses must be in such a way that no more than 1 input address defining a defective word location is associated with each combination of an A translation PROM 42 data state and a B translation PROM 44 data state.

Figure 3:
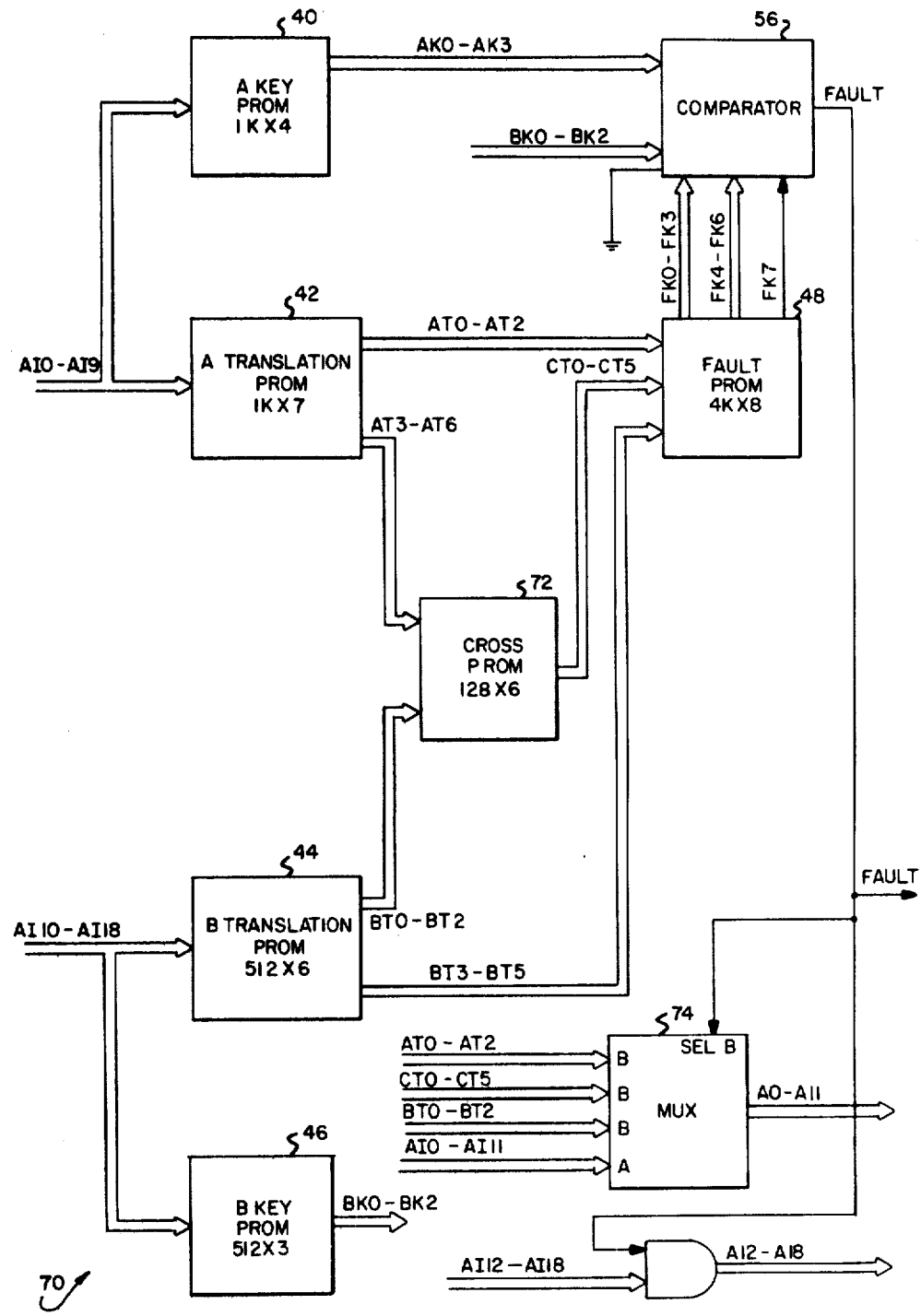
FIG. 3 is a schematic representation of an alternative embodiment of a memory address translator in accordance with the invention.

An alternative arrangement of an address translator 70 which affords more flexibility in the assignment of translation addresses to input addresses for defective word locations is illustrated in FIG. 3. Although represented in a slightly simplified form, the address translator 70 is essentially the same as address translator 20 shown in FIG. 2 except that an addressable data store referred to as a cross-PROM 72 is inserted between some of the data outputs of A translation PROM 42 and B translation PROM 44 and 6 of the address inputs to fault PROM 48. Cross-PROM 72 is a 128 word by 6 bit store which receives four of the output data bits designated AT3–AT6 from A translation PROM 42 as a first part address input and three of the output data bits designated BT0–BT2 from B translation PROM 44 as a second part address input. The remaining output data bits BT3–BT5 are coupled as address inputs to fault RPOM 48. Cross-PROM 72 thus receives a total of 7 bits of address input which permit unique selection of the 128 words stored therein, only half of which will actually be used.

In general, the 12 bit input and 7 bit output of fault PROM 38 creates a two dimensional array of 4K by 128. Each of the 4K input address states or words must have mapped onto it 128 of the 512K system input address states, not more than one of which is to be translated. The 7 bit key data output determines which one is to be translated.

However, grouping of the input address bits into an A group (AI0–AI9) and a B group (AI10–AI19), while reducing the size of the first stage code assignment PROMS 40, 42, 44, 46, imposes restrictions on the assignment of input address states or words to memory address states or words. The FIG. 2 arrangement in effect creates two, two dimensional arrays, (AK0–AK3)×(AT0–AT5) and (BK0–BK2)×(BT0–BT5). Now instead of the freedom to arbitrarily assign the input address states corresponding to defective word locations to one of 4K translation addresses or states, the A group must be assigned to a 64×16 array and the B group must be assigned to a 64×8 array. Preservation of uniqueness requires that each of the 64 AT states (AT0–AT5) correspond to a maximum of 64 defects which must be distinguished by assigning each to a different one of 64 BT states (BT0–BT5). Similarly each 64 BT states (BT0–BT5) must correspond to a maximum of 64 defects which must be distinguished by assigning each to a different one of 64 AT states (AT0–AT5). These restrictions result in the difficulty of actually assigning more than 3500 errors out of a full capacity of 4096.

The use of cross-PROM 72 in FIG. 3 adds an additional dimension or degree of freedom to the assignment of input addresses to fault addresses that eases these restrictions. The statistical probability is that close to full error capacity can be mapped from the B input address group into the (BT0-BT5)×(BK0-BK2) second stage array. The limit on successful mapping will most likely occur upon the subsequent mapping of the A address group into the (AT0-AT5)×(AK0-AK3) second stage array.

In the arrangement of FIG. 3, a 7th output bit is added to A translation PROM 42, thus creating a 128×16 (AT0-AT6)×(AK0-AK2) array into which the A input lines or states may be mapped with relative statistical ease, leaving half of the output states unfilled. The cross-PROM 72 now creates a set of five third stage arrays or dimensions, (AK0-AK3), (AT0-AT2), (CT0-CT5), (BT3-BT5) and (BK0-BK2).

Each A input address state corresponding to a defective memory location must be definable by a unique combination of (AK0-AK3), (AT0-AT2) and (CT0-CT5) while each B input address state corresponding to a defective memory location must be simultaneously definable by a unique combination of (CT0-CT5), (BT3-BT5) and (BK0-BK2). Cross-PROM 72 thus eliminates the strict requirements of a 64×64 array defined by the translation address (AT0-AT5) by (BT0-BT5) and adds additional flexibility which permits a given A or B input state to correspond to more than 64 fault locations or the assignment of input states for defective word locations that might not otherwise be possible to assign because of restrictions.

Figure 4:
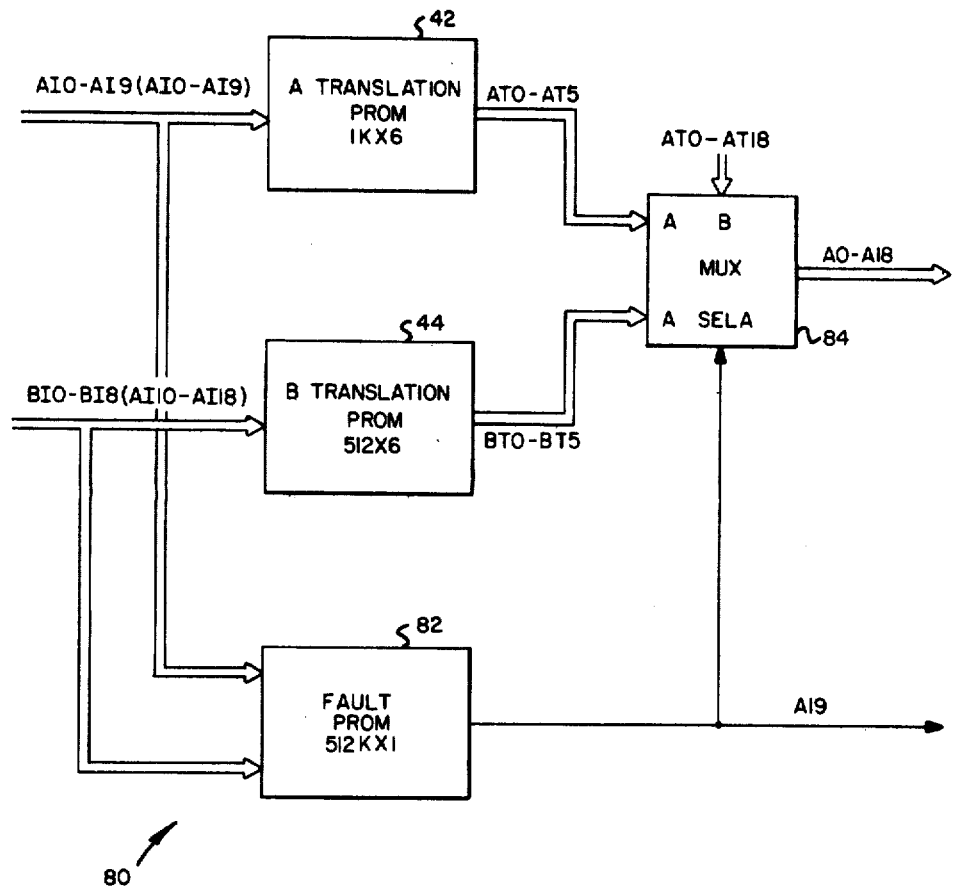
FIG. 4 is a schematic representation of an alternative embodiment of a memory address translator in accordance with the invention.

FIG. 4 illustrates an arrangement of an address translator 80 in which a 512K by 1 fault PROM 82 receives all 19 bits of input address information, AI0-AI18, and outputs a single bit defining translated address bit AT19 and controlling a multiplexer 84. A logic 1 data output from fault PROM 82 accesses the target storage module 26 and causes multiplexer 84 to select the A inputs consisting of translated address bits AT0-AT5 from A translation PROM 42 and translated address bits BT0-BT5 from B translation PROM 44. The remaining A inputs corresponding to outputs A12-A18 are presumed to be logic 0. Multiplexer 84 outputs the low order 19 bits of the translated address, A0-A18. In this arrangement, fault PROM 82 stores a one bit word for each addressable data store word. If the word is defective, a translated address is assigned thereto by the translation PROMs 42, 44 and a one is stoed by fault PROM 82. If the location for a given input address is not defective, a 0 is stored by fault PROM 82. This arrangement is more flexible than the arrangements of FIGS. 2 and 3 in that it imposes no constraints upon the assignment of translated addresses to input addresses for defective word locations. The full capacity 4K words of translated storage in target storage module 26 can always be used. At the same time, the separation of the input addresses into two dimensions significantly reduces the size of the A and B translation PROMs 42, 44. The disadvantage of the arrangement of FIG. 4 is, of course, the large size of the fault PROM 82. 1981 prices for data storage elements implementing the fault PROM 82 render the arrangement of FIG. 4 less economical than the arrangements of FIGS. 2 and 3.

Figure 5:
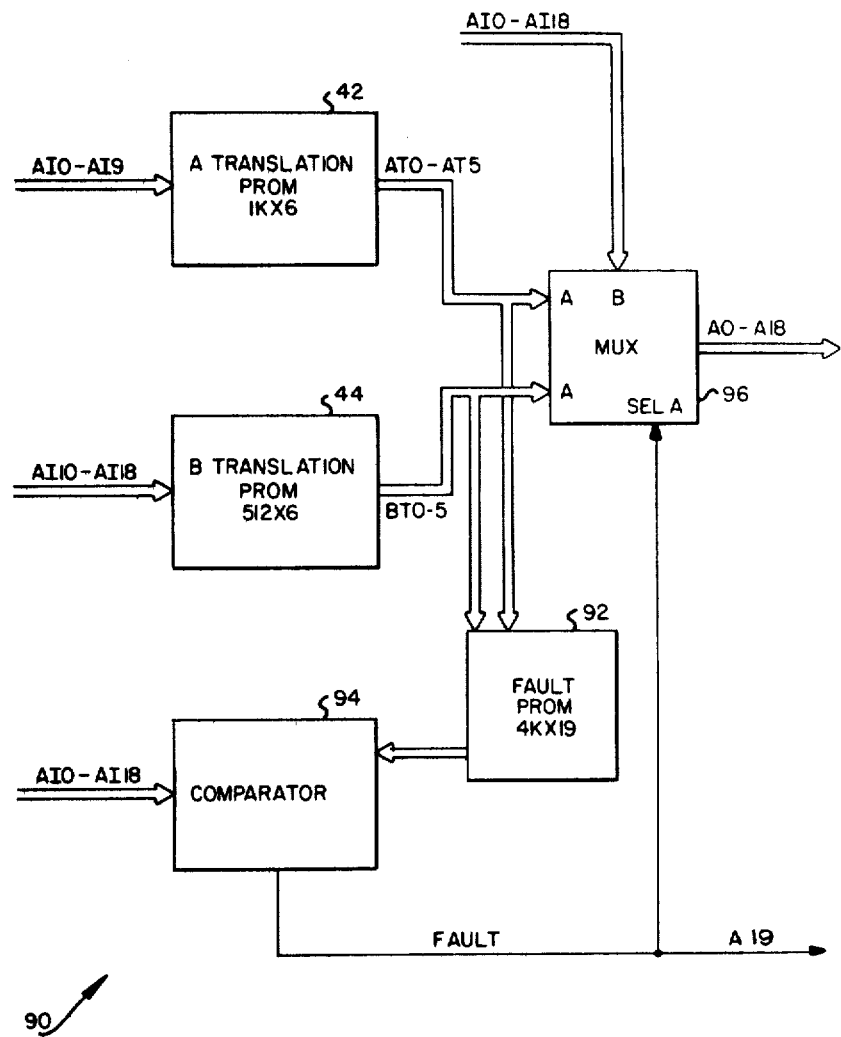
FIG. 5 is a schematic representation of an alternative embodiment of a memory address translator in accordance with the invention.

FIG. 5 illustrates an address translator 90 which is still another arrangement of an address translator in accordance with the invention which separates the incoming address signals into multidimensional fields.

In the arrangement of FIG. 5, incoming addresses associated with a defective word location are translated to a location within target storage module 26 by the A and B translation PROMs 42, 44. A 4K by 19 fault PROM 92 stores the full 19 bit input addresses for the defective word locations which are being translated. A comparator 94 receives the 19 input address bits or signals as well as the 19 bits of data from fault PROM 92 and upon attainment of a full comparison generates an output signal designated fault which drives the most significant translated address bit A19 and also drives a select A input to a multiplexer 96. Multiplexer 96 receives translated address bits AT0-5 from A translation PROM 42 and translated address signals BT0-BT5 from B translation PROM 44 at its A inputs and the input address signals AI0-AI18 at its B input.

Consequently, each time the translated address output of the A and B translation PROMs 42, 44 addresses a word location within fault PROM 92 which stores the current input address, comparator 94 generates an output indicating that an address translation should be made and causes multiplexer 96 to substitute the 12 bit output of the A and B translation PROMs 42, 44 for the input address. It thus becomes possible to accommodate all addresses by assigning 128 address states to each of the 4K translation states stored by translation PROMs 42, 44 with fault PROM 92 indicating which one of the 128 addresses corresponds to a defective word location which is to be translated with the other 127 addresses being passed through multiplexer 96 unchanged.

Figure 6:
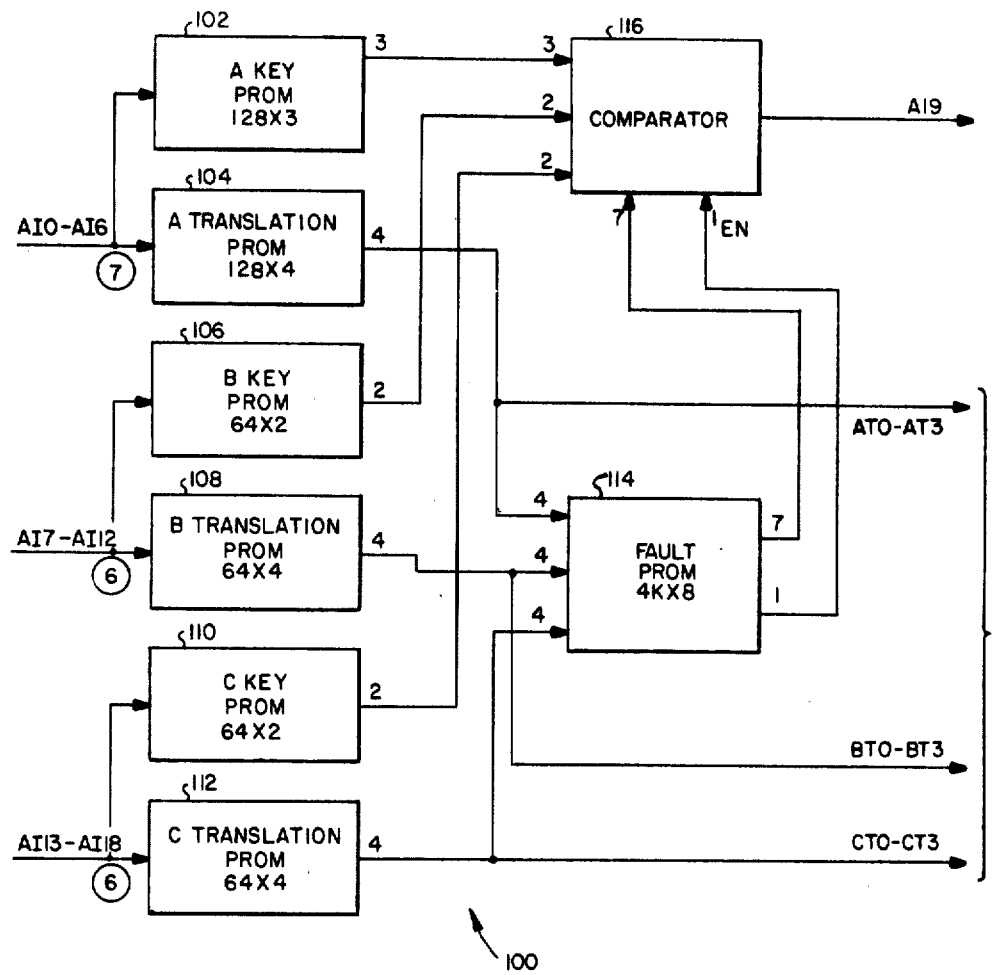
FIG. 6 is a schematic representation of a three-dimensional alternative embodiment of a memory address translator in accordance with the invention.

FIG. 6 illustrates an address translator 100 which is operationally similar to address translator 20 shown in FIG. 2 except that the input addresses are separated into three dimensions or groups designated A, B and C. Input addresses AI0-AI6 are communicated to a 128 word by 3 bit A key PROM 102 and also to a 128 word by 4 bit A translation PROM 104. The 7 data bits stored by the A PROMs 102, 104 provide a unique 1 to 1 and onto mapping of the input address bits AI0-AI6 into the data states defined by the 7 data bits of the A PROMs.

Input address bits AI7-AI12 are coupled to the address inputs of a 64 word by 2 bit B key PROM 106 and to a 64 word by 4 bit B translation PROM 108. The 6 data bits of the B key and translation PROMs 106, 108 provide a unique 1 to 1 and onto mapping of the 6 input address bits AI7-AI12 into the states defined by the 6 bits of data stored in the B PROMs. In a similar manner a C key PROM 110 and a C translation PROM 112 receive the remaining 6 input address bits AI13-AI18.

As with the arrangement of FIG. 2, the 12 data bits stored by the A, B and C translation PROMs 104, 108, and 112 are combined to generate the translated address signals AT0-AT11 which are communicated to a 4K by 8 fault PROM 114.

At each word location within fault PROM 114 there is stored 7 data bits identifying the particular key states identifying the one of a plurality of key states which are associated with the defective input address which is being translated to the particular word address within fault PROM 114. That is, three of the 7 data bits correspond to three bits stored by A key PROM 102, two of the data bits are associated with the two data bits stored by B key PROM 106 and the remaining two of the 7 data bits corresponds to the two data bits stored by C key PROM 110. The fault PROM 114 also stores an eighth data bit at each word location which indicates whether or not the particularly addressed word within fault PROM 114 represents a translation address or merely an unused address. This eighth bit is communicated as an enable signal to a comparator 116. Comparator 116, when enabled by an indication of a fault address from the eighth bit of fault PROM 114, compares the 7 bits from fault PROM 114 with the corresponding 7 bits from the key PROMs 102, 106, and 110 and generates at its output the most significant address translation signal AT19. This 20th bit is also communicated to the select B input of a multiplexer (not shown) which responds by outputting the 12 data bits from the translation PROMs as the memory address signals A0–A11. In the absence of a logic 1 output from comparator 116 the multiplexer merely passes through the input address signals AI0–AI18 as the memory address signals A0–A18 respectively.

Separation of the input addresses into three dimensions rather than two dimensions does not change the basic operation of the translator 100, but does reduce the total cumulative size of the translation and key PROMs and affect the assignment of translation addresses. For example, in the two dimensional arrangement such as as is shown in FIG. 2, an A address line may have a maximum of 64 defective word locations thereon out of a possible 512. In the arrangement shown in FIG. 6, the A dimension must be conceptualized as combining separately and independently with both the B dimension and the C dimension to define one of 128 BC planes. Each BC plane representing a defective address location must be assigned to one of 16, 16×16 BT CT planes, thus accommodating up to 256 errors in a single BC plane out of 4096 input address states. Similarly, each 128×64 AB plane representing a defective address location must be assigned to one of 16 AT BT planes and each 128×64 AC plane representing a defective address location must be assigned to one of 16 AT CT planes.

Figure 7:
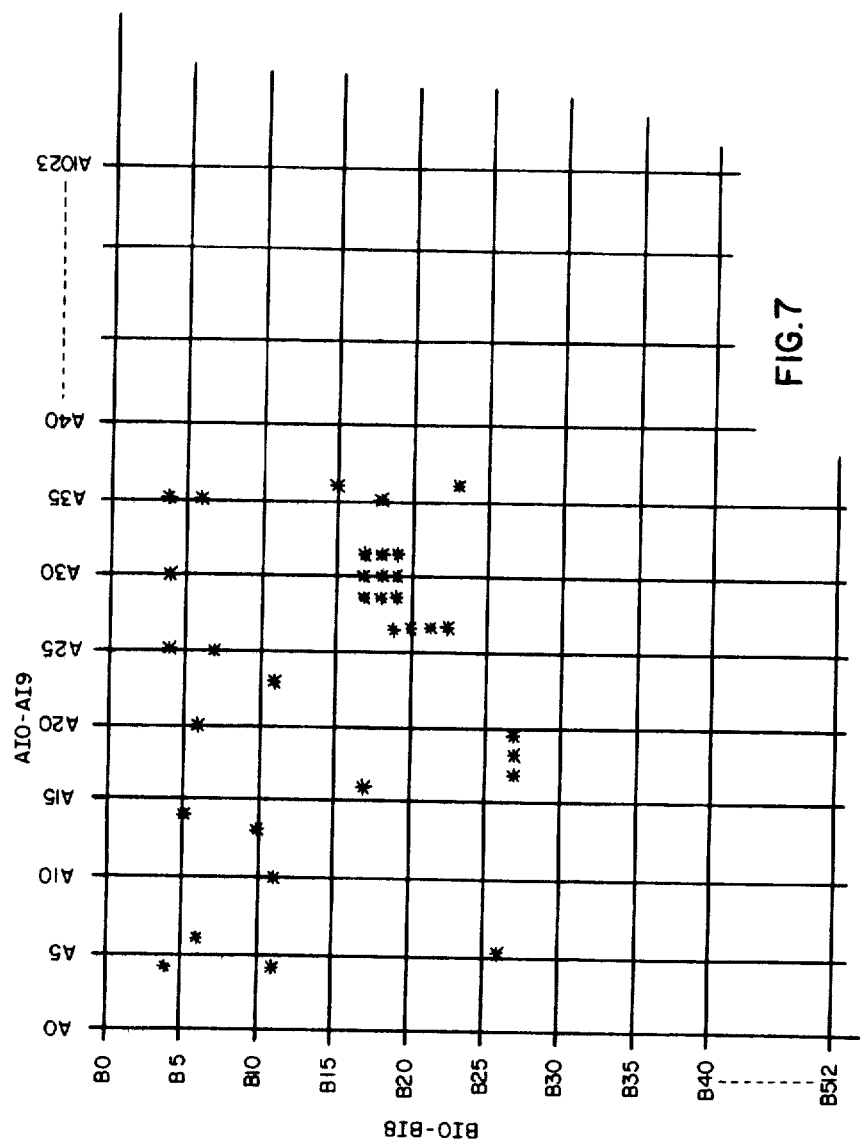
FIG. 7 is a two dimension memory map illustrating addresses to be translated for an example in accordance with the invention.
Figure 8:
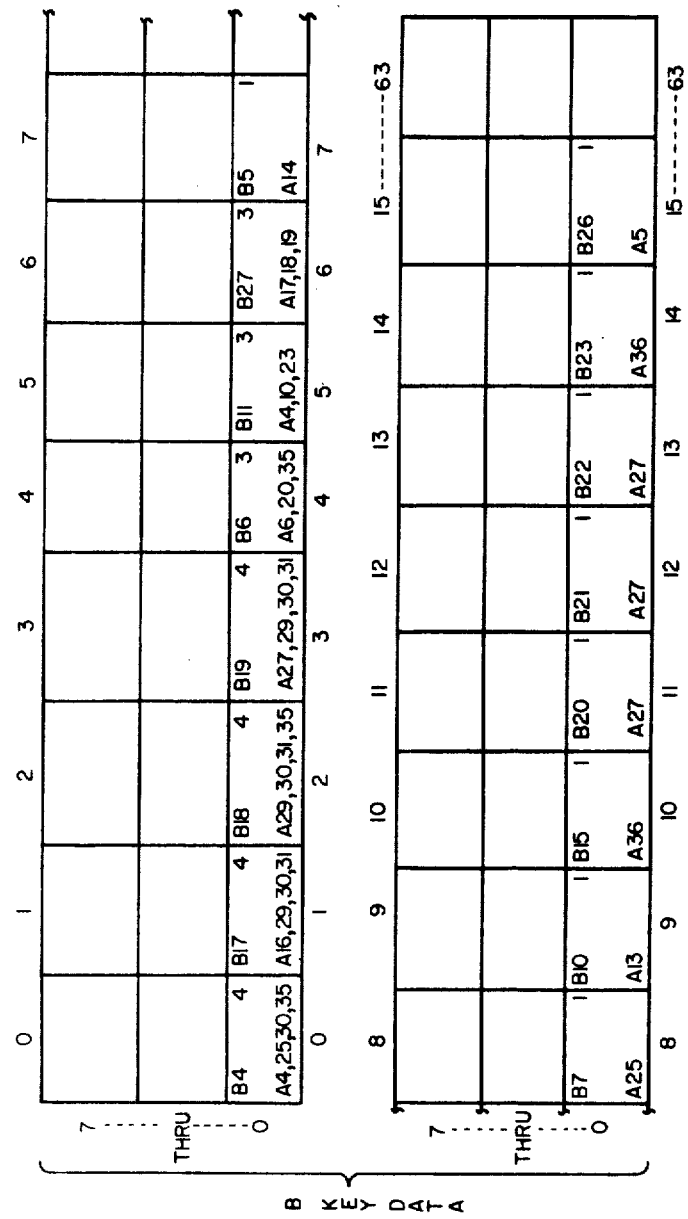
FIG. 8 is a two dimension B Key Data and B Translation Data map for the example in accordance with the invention.

The manner in which data states are assigned to the word address locations of the PROMs for the embodiment of the invention shown in FIG. 2 may be better understood with reference to FIGS. 7–9. FIG. 7 illustrates the conceptualization of the separation of the incoming addresses into a first dimension A group and a second dimension B group. The result is a plane with the A group addresses incrementing horizontally from left to right and with the B group addresses incrementing vertically from top to bottom. Each A group address line intersects each B group address line and similarly each B group address line intersects each A group address line. Each of these intersection points represents an input state or word location within main storage module 24. A portion of these word locations are assumed to be defective and have been marked with an *. For convenience of illustration, the defective word addresses have been concentrated in the upper lefthand corner of the AB plane. However, in general it would be expected that the defective address locations would be distributed randomly over the entire AB plane.

In order to facilitate the assignment of translation and key data states to input addresses to the A PROMs and B PROMs it is helpful to list the lines intersecting defective word locations as in Table I and Table II. In Table I each of the B lines which intersects a defective word location is listed in column Bi. Opposite each listed line, there is indicated in column n(Bi) (later called SB) the total number of defective word locations which are intersected by the line. In the next column, designated ABi, there is listed the A line intersections of each of the defective word locations intersected by the given B line. That is, B line B4 corresponding to binary encoded input address 000000100 for address lines AI10–AI18 respectively has an intersection with four defective word locations which occur at A lines A4, A25, A30 and A35. The last, or map order column, lists the B lines sequentially in order of the number of defective word locations which are intersected thereby with the B lines intersecting the most defective word locations being ordered first.

In Table II, column Ai lists the A dimension lines which intersect defective word locations with column n(Ai) (later referred to as SA) listing the number of defective word locations which are intersected by the corresponding lines in column Ai. Column BAi lists the intersections with the B dimension lines at which defective word locations occur. The map order column provides a sequential numerical listing of the A lines which intersect defective word locations in order of the number of defective word locations which are intersected with the greatest number being ordered first.

It is also helpful to utilize the arrays shown in FIG. 8 and FIG. 9 in assigning data states to the A and B PROMs. These figures divide the data contents of the PROMs into a translation data dimension along the horizontal axis and an orthogonal key data along the vertical axis. The B PROMs shown in FIG. 8 have a 64 by 8 configuration and are shown in two sections, one above the other, to better conform the array to the shape of the available drawing space. FIG. 9 illustrates the 64 by 16 array of data states for the A translation PROM 42 and A key PROM 40.

For the present example, data states will be assigned to the translation and key PROMs with an even or level packing for the B PROMs and a close packing for the A PROMs. That is, referring to FIG. 8, an attempt will be made to fill the 64 possible error locations associated with each of the 64 B translation states evenly so that all of the B translation states are filled by an approximately equal amount as B lines are assigned to the FIG. 8 B map. For example, line B4 is assigned to BK0, BT0 and intersects 4 fault locations at A lines A4, A25, A30 and A35. Four of the 64 available fault states are thus consumed by this assignment. Until all of the other B translation states BT1–BT63 have at least four fault states mapped thereto there will not be another first attempt to map a second B line to B translation state BT0. The PROM mapping program discussed infra would subtract the four assigned faults from the 64 maximum to indicate 60 available states. Additional B lines are then mapped to B translation states on the basis of the most available fault states. If a conflict prevents mapping to the B translation state with the most available fault states, the B translation state with the second most available fault states is tried and so forth.

Instead of even packing, a close or maximum packing approach is preferred for assigning A lines to the A map as shown in FIG. 9. An attempt is made to first fill all 64 fault states of A translation state AT0, then AT1, then AT2 and so forth. If a conflict prevents mapping of an A line to AT0, an attempt is made to map it to AT1, then AT2 and so forth. The most dense assignment of faults to A translation states thus occurs at the lower numbered states with the possibility of the higher numbered states having no faults assigned to them. The encoded A translation bits are then made the most significant address inputs to the target storage module 26 and to the fault PROM 48. If, for example, the top eight A translation states AT56–AT63 remain empty, then the last 512 words of fault PROM 48 will never be addressed and need not be implemented, thus reducing the cost of the translator 28, which is implemented with 512 word by 8 bit modules. In general the amount of fault PROM 48 that can be eliminated, if any, will depend upon the number of input address states that must be translated and the efficiency with which they can be assigned to the lower ordered A translation states without conflict. If the last 16 A translation states AT48-AT63 were to be left empty, then the last 1K words of fault PROM 48 could be left unimplemented. In addition to the possible reduction in fault PROM 48 costs it is believed that even packing of the B lines into the B map increases the number of A lines that can be assigned to the A map without conflict, the mapping of A lines without conflict being the most likely limit upon the maximum number of fault states that can be mapped.

Although the A and B dimension lines which intersect no defective word locations are not explicitly shown in the tables and drawings, these are also assigned states in the A and B arrays in accordance with the one to one and onto mapping. However, because there is no problem of avoiding multiple B lines associated with A lines and multiple A lines associated with B lines in the assignment of nondefective addresses (there being no assignment of a corresponding key state in fault PROM 48) there will never be any problem assigning A or B lines which do not intersect a defective word location to its respective A or B array data state. These lines may simply be assigned last (they intersect 0 word locations) to any data state which is available after the assignment of address lines which do intersect defective word locations.

The A and B address lines which do not intersect defective word locations actually represent a don't care situation and alternatively all such A addresses could be assigned to a single data state within the A array and all such B addresses could be assigned to a single data state within the B array. It is simply necessary to assure, that in programming the fault PROM 48, that the corresponding word location therein is programmed to assure that comparator 56 does not produce a match so that no address translation occurs for these A and B lines which do not intersect a defective address location.

In the present example, after all of the B address lines have been assigned to the B array in FIG. 8, the A address lines will then be assigned to the A array in FIG. 9. While the above process is conceptualized as assigning A lines to the AK×AT A map and B lines to the BK×BT map, it should be remembered that actually the A lines are input address states or word locations for the A PROMs 40, 42 and the AK and AT states are the data assigned to the corresponding word locations in encoded form. Similarly, the B lines represent input address states or word locations for the B PROMs 44, 46 and the BK and BT states represent the data stored in the corresponding word locations in encoded form.

Referring now to Table I, the map order column indicates that B dimension line B4 is the first to be assigned. This being the first entry, there is no possible conflict and line B4 is assigned to data state 00. That is, B key data BK equals 0 and B translation data BT equals 0. Line B4 intersects four defective word address locations corresponding to A lines A4, A25, A30, and A35. This data along with the total number of errors is indicated in the array space provided in FIG. 8 for the B array at location 0,0.

The second entry in Table I in map order is B liine B17 which intersects four defective word locations at A lines A16, A29, A30 and A31. B line B17 is readily assigned data state 0,1 in the array shown in FIG. 8 and the associated total number of defective word locations and corresponding A line intersections are indicated therein. Since this is the first entry into BT1 there are no possible conflicts from the assignment of the same associated A line to BT1 twice.

Line B18 has associated therewith four defective word locations at intersections with lines A29, A30, A31, and A35. In accordance with the preestablished pattern of evenly filling the 64 fault states for each B translation state, line B18 is entered at B map location 0,2. The four defective word locations and corresponding A line intersections are indicated in the available space. Again, the first entry into a given translation state poses no conflicts unless the number of associated faults for a B line exceeds 64.

Table I indicates that the next B line to be assigned is line B19. Line B19 has associated therewith four defective word locations at the intersection with lines A27, A29, A30 and A31. Line B19 can be assigned data state 0,3 in the B array shown in FIG. 8. In a similar manner all of the B lines listed in Table II can be assigned a data state in the B array shown in FIG. 8 with care being taken that the B line is not assigned to a BT column such that the A lines associated therewith are also associated with a B line previously assigned to the same column.

In the present example there have not been a sufficient number of errors to provide entries in all of the BT columns. However, in an actual memory it would be expected that most of the 512 B lines would have at least one fault associated therewith. After the first 64 B lines have been located on the B map it will be necessary to map the 65th B line into a BT column already occupied by a B line. The BT column having the fewest number of fault states assigned thereto is selected first and will quite likely be column BT63. Deviating from the present example to illustrate the point, assume that BT63 has assigned thereto line B14 with four fault intersections at A10, A75, A76 and A200. Column BT62 might have line B510 assigned thereto with five fault intersections at A10, A35, A501, A729 and A1023. All other BT columns would have a B line mapped thereto with five or more associated faults.

The next or 65th B line to be mapped might be line B485 with four fault intersections at A25, A75, A501, and A842. Column BT63 would receive the first mapping attempt since it has the fewest number of fault states mapped thereto. However, fault A75 associated with line B485 conflicts with fault A75 associated with previously mapped line B14. The next least occupied BT column is then selected, which might be column 62. However, fault A501 associated with line B510 conflict with fault A501 associated with line B485 so column B62 cannot be used. Additional columns, such as BT61, are attempted until line B485 can be mapped without a conflict from the associated faults. A conflict would be equivalent to assigning the same translated address to two different input addresses identifying defective storage locations.

After completion of the B map, the A lines are assigned to the A map as shown in FIG. 9. The process is essentially the same except that each A line is assigned to an AT state with as low a number as possible of available fault vacancies instead of evenly to the AT state with the most available fault vacancies out of 64 possible.

Referring to Table II, line A27 is the first to be assigned with four faults at B19, B20, B21 and B22. It is assigned without conflict to location 0,0. Next is line A30 having four faults at B4, B17, B18 and B19. Fault B19 conflicts with fault B19 of line A27, forcing assignment to location 0,1. The third line to be assigned is A35 with three fault intersections at lines B4, B6 and B18. Line A35 can be assigned to location 1,0, the first location attempted. Next, A29 is assigned to location 0,2 and the process continues with each line being assigned to the lowest number nonconflicting AT state until all A lines have been assigned to the A map as shown.

After all of the A lines associated with faults have been mapped, the remaining lines, such as A0 can be mapped to the remaining available AK, AT states.

The arrays shown in FIGS. 8 and 9 now define the data which must be entered into the A and B PROMs. Referring to FIG. 8, it will be seen that address B4 is assigned data state 0,0 (modulo 64). Address word 4 within B translation PROM 44 is thus loaded with 0 (modulo 64) and address word 4 within the B key PROM 46 is loaded with data state 0 (modulo 8) also. Continuing with the B array it can be seen that address word 17 of B translation PROM 44 is loaded with data state 1 (modulo 64) while address word location 17 within B key PROM 46 is loaded with data state 0. Similarly, it will be seen that address locations 18, 19, 6, 3, 27 and 5 within B translation PROM 44 are loaded with data states 2, 3, 4, 5, 6 and 7 (modulo 64) respectively. Data state 0 is loaded into the B key PROM 46 for all of these address locations. Similarly, the A array shown in FIG. 9 shows the data states for the A translation PROM along the horizontal axis and the data states for the A key PROM 40 along the vertical axis with the corresponding A input addresses being indicated at the intersection areas. That is, data state 0,0 is loaded into the A key PROM 40 and A translation PROM 42 at address location 27. At A input address 30 data state 1 (modulo 64) is loaded into the A translation PROM 42 and data state 0 is loaded into the A key PROM 40. In a similar manner, the proper data state is loaded into the address word locations in the A PROMs 40, 42 for each input address.

The data contents of fault PROM 48 can be derived from the A and B arrays shown in FIG. 9 and FIG. 8. For example, fault PROM address 0,0 corresponds to A array column AT0 and B array column BT0. This corresponds to defective error location A35, B4. In the A array, address A35 corresponds to A key data 1 so that 1 (modulo 16) must be loaded into the first four bit positions of fault PROM address 0,0. Similarly, in the B array, line B4 corresponds to BK=0 so that 0 (modulo 8) must be loaded into the next three data bit positions of address 0,0. Finally, a 1 is loaded into the eighth bit position to indicate that this address corresponds to a defective word location which requires translation into the target storage module 26. For PROMs having an unburned state of all 1's, a 0 would probably be used to indicate a valid translation state.

Similarly, fault PROM address 0,1 corresponds to A array column AT0 and B array column BT1. Defective address location A16, B17 is common to these columns. Address A16 is assigned A key data state AK1 so that 0001 must be loaded into the first four bits of fault PROM address location 0,1 (modulo 64). Address line B17 corresponds to B key data state BK so that 000 is loaded into the next three bits of word location 0,1 (modulo 64) in fault PROM 48. The eighth bit of this word location is loaded with a 1 to indicate that it represents a defective address location requiring translation into target storage module 26. In similar manner, each defective word location corresponds to a unique combination of an A array column AT and a B array column BT. This combination defines an address in the fault PROM 48 with the data at the address being loaded with the corresponding four bits of A key data, three bits of B key data and a 1 to indicate the correspondence to an address for a defective word location which requires translation into the target storage module 26. Not all of the available 4K locations in fault PROM 48 are utilized and the unused locations such as address 0,8 (modulo 64) are loaded with a 0 in bit number 8 to indicate that an address translation is not to be made and to inhibit a fault output from comparator 56. Table III illustrates the data contents of the fault PROM 48 for each of the active addresses in the present example. The column labeled defective address indicates the intersection of the A line and B line to which the defective word location for the address being translated corresponds.

In operation of the address translator 28, assume that address 0000000100 000000100 corresponding to two dimensional address A4, B4 is received by data store 20 from controller 16 along with an appropriate read or write command. This causes address location 4 within A key PROM 40 and A translation PROM 42 to be accessed. These PROMs store 0001 and 000010 respectively at these locations. Similarly, this input address causes location 4 within B key PROM 46 and B translation PROM 44 to be addressed. These locations also store 000 and 000000 respectively. As a result, A translation PROM 42 presents the six bits 000010 to fault PROM 48 and to the A input of multiplexer 50. Similarly, B translation PROM 44 presents the six bits 000000 to fault PROM 48 and also to the A input of multiplexer 52. At the same time, A key PROM 40 presents the four bits 0001 to comparator 56 while B key PROM 46 presents the three bits 000 to comparator 56. The twelve bits of data provided to the address input of fault PROM 48 cause address location 2,0 (modulo 64) to be addressed and, as shown in Table III, fault PROM 48 responds by presenting the eight bits 10001 000 to comparator 56. These eight bits of data match the other eight bits of data received by comparator 56 causing comparator 56 to generate a logic 1 fault signal at its output. This signal is inverted by NAND gate 60 to a logic 0 level to cause multiplexers 50 and 52 to select their A inputs for output as translated memory address signals A0-A5 and A6-A11 respectively. The logic 0 output of NAND gate 60 is further inverted by NAND gate 62 to generate the twentieth memory address signal A19 at a logic 1 level to cause the data storage module to select the target storage module portion 26 thereof. The input address A4, B4 is thus translated to translated memory address location 2,0 (modulo 64) within the target storage module 26 which then proceeds to read or write data at that address location therein in a manner which is transparent to the controller 16 except for a slight time delay of approximately ¼ microsecond which is required to accomplish the address translation.

DATA ASSIGNMENT PROGRAM

The data assignment program must operate to assign the A input line states to the A map (FIG. 9) and the B input line states to the B map (FIG. 8). Once these assignments are made the data content of the A, B, and fault PROM are inherently defined and the lists required for programming or "blowing" these PROMs are readily derived. The assignment of A and B input states to the A and B map must be consistent with the following rules:

1. No more than 64 (NBT) errors (mapped element) can be associated with each A input code. This is because a single A input code must be assigned to a single AT column in the A map and multiple errors associated therewith must be distinguished by assignment of the corresponding B input line states to different BT columns in the BT map. There are 64 BT columns in the B map in the present arrangement.

2. No more than 64 (NAT) errors (mapped element) can be associated with each B code. This is simply the converse of No. 1 above.

3. The assignment of an A input line state having a fault or mapped element associated therewith to the A map must be a one-to-one mapping.

4. The assignment of an input B line state having a fault or mapped element associated therewith to the B map must be a one-to-one mapping.

5. The A input line and B input line assignments to the A and B map must be in such a way that no more than one fault or mapped element is associated with each combination of a BT column and an AT column.

A statistical study has indicated that these restrictions limit the actual number of states that can be translated to something less than the actual hardware capacity (4096 in the present example). An algorithm that will map approximately 3500 elements out of a maximum capacity of 4096 with a probability in excess of 99%, is illustrated by the program flow chart shown in FIG. 10. A listing of a corresponding program in the BASIC programming language is set forth in Table V hereafter. Table IV provides a definition of important terms used in the algorithm flow chart while Table VI provides a correlation between the terms defined in Table IV and the terms used in the program set forth in Table V. Limitations on the use of variable names inherent in the basic program language necessitated a substitution of terms in many instances.

Figure 10:
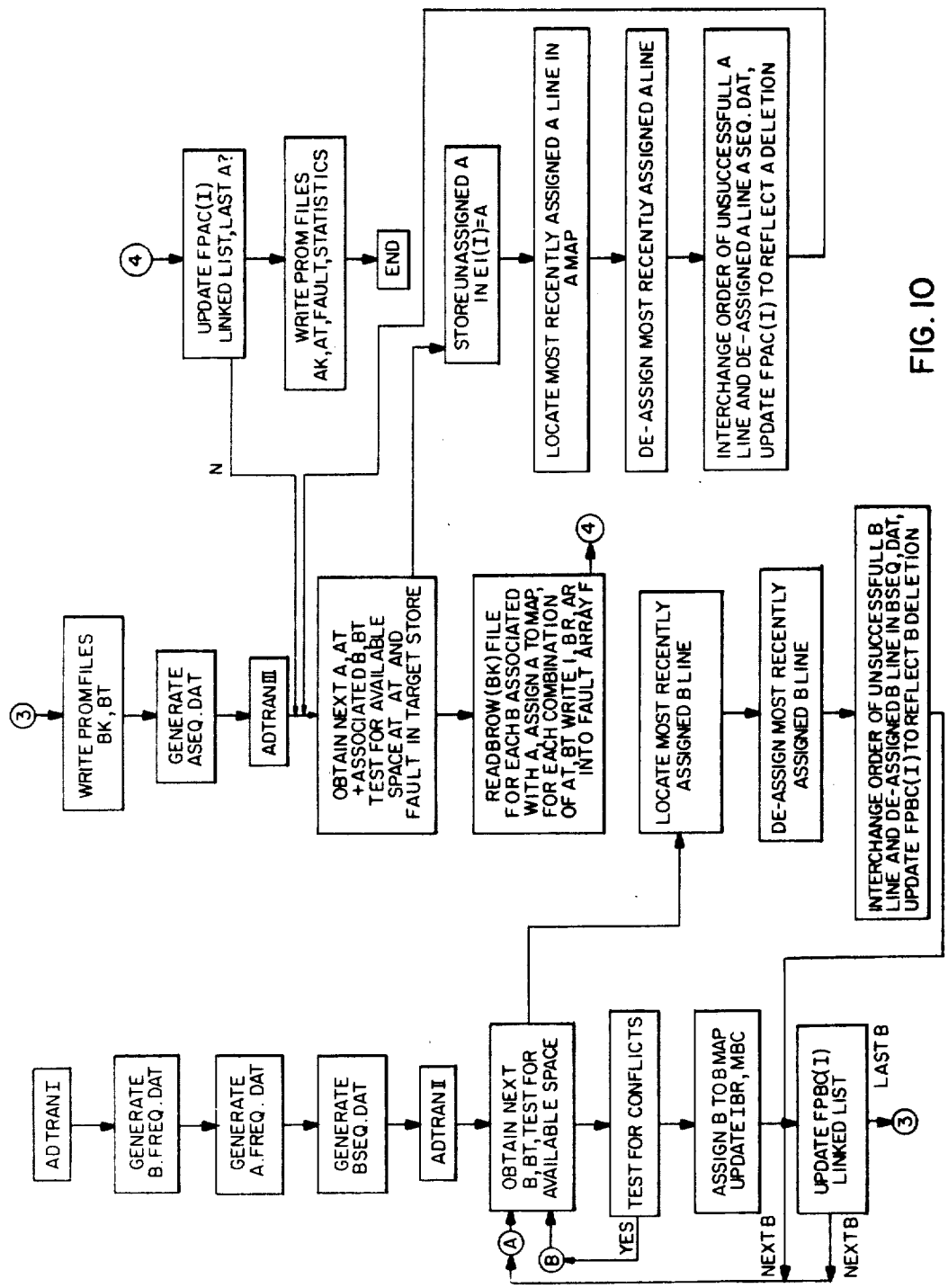
FIG. 10 is a flow chart illustrating an algorithm for assigning data states to data stores in the mapping system shown in FIG. 2.

The algorithm shown in FIG. 10 first assigns the B input codes to the B map in the order of the most to least fault states or mapped elements which are associated with each B code. The algorithm then assigns the A input codes to the A map in order of most to least fault states or mapped elements associated with each A input code. Because there are half as many B input lines as A input lines, there are twice as many fault states per line and the probability of a successful mapping of a large number of errors is therefore diminished. Mapping of the B lines first eliminates restrictions that might otherwise be imposed by the prior mapping of A lines and thereby increases the probability of successfully mapping a given number of B lines. The B lines are mapped within an even packing in which a next B line is preferentially assigned to a BT column state in the B map having the most available fault states, there being 64 total. The BT columns are listed in sequential order by number of available fault states and if a conflict prevents a mapping to the BT column with the most fault states, the next and then subsequent BT columns are attempted and until a successful mapping is achieved or all BT columns have been exhausted.

After the B input lines are mapped, the A input lines are mapped with a close packing. A input lines are also mapped in order of most associated mapped states to least. The A input lines are mapped with a close packing order in which an attempt is made to first fill the AT0 state, then the AT1 state, then the AT2 state and so forth. This close packing is believed to optimize the probability of successfully assigning all of the A lines to the A map where a large number of mapped states are involved. Close packing further has the advantage of potentially leaving the high numbered AT states with no mapped element or fault assignments empty in the event that less than the full capacity of mapped states are being mapped. It may then be possible to reduce the cost of the translator 28 by not having to physically implement the high order address locations of fault PROM 48.

A total of 2300 mapped elements can be accommodated relatively easily and the program has a provision to reduce running time by simply treating the AT elements in sequential order from AT0 to AT63 if the total number of errors to be mapped is less than 2300. However, if the total number of errors exceeds 2300 the sequential order of the AT elements is initialized at AT0 to AT63 and modified to reflect faults in target store 26, but is updated after each A line entry to maintain the sequential order from the greatest number of fault states or mapped elements to the least number of available fault states or mapped elements. The first alternative is in effect an approximation of the second, preferred alternative, which reduces program running time.

In the event that the program is unable to assign a given B line to the B map or a given A line to the A map because of a conflict, the preceding input line is deleted from the map assignment and interchanged in sequential order with the unassigned input line. If the unassigned input line is still unassignable, the next preceding input line is deassigned from its corresponding map and interchanged in the sequential order of assignments with the unassigned input line. This process continues until the unassigned input line is assigned without conflict. The normal assignment process then resumes with the input lines which had been deassigned being reassigned to the corresponding map.

The number of each unsuccessfully assigned line is stored in an array E1(I) to preclude an endless loop where each of two lines may be assigned only after the other has been deassigned.

Referring now to FIG. 10, it will be seen that the data assignment program is divided into three main parts designated ADTRAN I, II and III. The use of three parts is not related to the algorithm, but merely accommodates restrictions imposed by the particular computer from which the program has been run. The three parts are simply chained together to provide one total program.

The program begins by accessing the input file designated ADDR.U. which contains the list of defective addresses or mapped elements which must be mapped from the input set of addresses to the output set of addresses. This list is utilized to generate a first file for the B group of input addresses, designated B.FREQ.DAT and a second file for the A group input addresses designated A.FREQ.DAT. These files have the general form of the first three columns of Table I and Table II and for each record list the input line number (whether or not there is a defective address location associated with the line) the number of defective address locations or mapped elements associated with the line, and the A input line intersection with the given B input line at each defective address location.

The program next generates the working file BSEQ.DAT which is derived from the B.FREQ.DAT file and lists the input address lines in sequential order from the greatest number of associated defective addresses to the least number of associated defective addresses. That is, a line intersecting 4 defective address locations such as line B4 in FIG. 7 would be listed ahead of a line intersecting 3 defective address locations such as line B6. This completes the first portion of the program designated ADTRAN I.

The program then chains to ADTRAN II which proceeds to assign the B group of input addresses to the B map, a table TB(I,J) storing data similar to FIG. 8. The program obtains the next input B line from the BSEQ.DAT information and obtains the next BT state from a linked list FPBC(I) which maintains the BT states in order of most available vacancies for receiving mapped elements or faults. After checking to be sure that the number of defective address locations associated with the current B line does not exceed the maximum number which can be mapped (64), the program tests for conflicts with previous assignments. That is, the current B line cannot be mapped to the current BT state if a fault location associated with the current B line corresponds to a fault location associated with a B line which has been previously mapped to the same BT state. If a conflict exists, the program returns to point B where a next BT state is obtained from the FPBC(I) linked list and this BT state is tested for conflicts.

When a BT state with no conflicts is found, the current B input line is assigned to that BT state at a KB key state indicated by a variable IBR(J) which indicates the next available BK row in the B map for each BT column, J. After the assignment to the B map the IBR(J) variable is updated by incrementing the element corresponding to the BT column to which the B input line was assigned. A second variable, MBC(J) stores the number of available vacancies for receiving faults or mapped states associated with each BT column. This variable is initialized at 64 and upon entering a B line to the B map, is updated by subtracting the number of fault locations associated with the assigned B line from the element of MBC corresponding to the BT column to which the B line have been mapped. The FPBC(I) linked list is then updated to maintain the BT columns in order of most available vacancies for receiving faults (MBC) to least available vacancies for receiving faults and the program returns to point A where a next B is obtained and tested for conflicts.

In the event that the program is unsuccessful in assigning a given B input line to any of the 64 BT columns, the program branches to locate the most recently assigned B line in the B map, TB(I,J). After this most recently assigned B line is located, it is deassigned with the associated variables such as IBR and MBC being updated to reflect the deassignment and the deassigned line is interchanged in order with the unsuccessfully assigned B line in the BSEQ.DAT file. The program then returns to point A to start over in its attempt to assign the unsuccessful B line with the sequential order of the unassigned B line moved up by one. Upon completing the assignment of all B lines to the B map, the program proceeds to point 3 where PROM files BK(I) and BT(J) are written. The BK file merely provides a sequential list of key row assignments in the B map, TB(I,J), in order or the B input line number. The BT file provides a sequential listing of the BT column assignments associated with each B input line in the order of the B input line number. The second part of the program then terminates with the generation of an ASEQ.DAT file from the A.FREQ.DAT file information.

Part III begins by obtaining the next A input row, the next AT column in the A map, and the associated B and BT column for each fault associated with the current A input line. This information is utilized to access input data files to determine if the AT column has an available BK row state and a sufficient number of unassigned vacancies for receiving fault states, MAC(J), to receive the A line entry and whether the A line entry would result in translation to an address within target storage module 26 which is defective. If the address is defective the next AT column is selected. A test is also made for conflicts between the B lines associated with the current A line and those associated with A lines previously assigned to the proposed AT column. If there are no test failures, the B row file (BK) is read for each B line which intersects the A line at a fault location, the A line is assigned to the A map, and for each combination of AT, BT corresponding to an error on the A input line, the terms 1, BR, and AR are written into the fault array F. The one indicates that the associated address corresponds to a mapped element or fault state and is to be translated, B row is the BK row state to which the B line is assigned and AR is the AK row state to which the A line is assigned. The F array thus defines the content of fault PROM 48.

The program then continues to point 4 where the FPAC(I) linked list is updated to reflect the most recent A line assignment and a test is made for the assignment of all A lines. If no, the program continues to the beginning of ADTRAN III to assign the next A line. If the last A line has been assigned, the program continues to write PROM files AK, AT, Fault, and Statistics. The AK and AT files correspond to the BK and BT files to define the content of the A key PROM 40 and A translation PROM 42. The fault file corresponds to the content of the fault array and defines the data for fault PROM 48. The statistics file merely stores data relating to the execution of the program and is not a material part of the data assignment algorithm.

In the event that a conflict precludes the assignment of an A line to one of the 64 AT column locations in the A map, the program branches to deassign the most recently assigned A line and interchange it in sequential order with the unsuccessfully assigned A line. This procedure is essentially the same as that for an unsuccessfully assigned B line.

The above described arrangements operate by translating the address for a complete 18 bit word any time a defect occurs within any one or more of the bits of the word within the main storage module 24. This results in some inefficiency in that 18 bits must be reassigned or translated when even one of 18 bits of the original word location is defective. It would of course be possible to subdivide each addressed word into groups of one or more bits with additional address lines or bits being assigned to select only one of these groups for address translation to avoid having to provide 18 spare bits to accommodate a single defective bit. However, in the present example of a core memory it has been found practical and cost effective to translate a complete word of stored data any time a single bit within the word is found to be defective. This is particularly true in the case of a core memory where data is accessed on a word at a time basis and the separation of data for a single output word into two internal words would require two memory cycles to generate the single output word. This would significantly slow effective memory cycle time. It should be further appreciated that even though a ¼ microsecond delay is associated with the address translator 28, where a plurality of memory cycles are to occur in succession, the delay for a next memory cycle can overlap the cycle time for a preceding memory cycle. When properly arranged, the ¼ microsecond delay thus affects only access time and not the data transfer rate.

While there have been shown and described above various arrangements of systems for selectively mapping a subset of a first set into a second set in the form of memory address translators, it will be appreciated that the invention is not specifically limited thereto. Accordingly, all variations, modifications, and equivalent arrangements within the scope of the accompanying claims should be considered to be within the scope of the invention.

TABLE I
B DIMENSION TABLE

| Bi | n(Bi) or SB | ABi | Map Order |
|---|---|---|---|
| B4 | 4 | A4, A25, A30, A35 | 1 |
| B5 | 1 | A14 | 8 |
| B6 | 3 | A6, A20, A35 | 5 |
| B7 | 1 | A25 | 9 |
| B10 | 1 | A13 | 10 |
| B11 | 3 | A4, A10, A23 | 6 |
| B15 | 1 | A36 | 11 |
| B17 | 4 | A16, A29, A30, A31 | 2 |
| B18 | 4 | A29, A30, A31, A35 | 3 |
| B19 | 4 | A27, A29, A30, A31 | 4 |
| B20 | 1 | A27 | 12 |
| B21 | 1 | A27 | 13 |
| B22 | 1 | A27 | 14 |
| B23 | 1 | A36 | 15 |
| B26 | 1 | A5 | 16 |
| D27 | 3 | A17, A18, A19 | 7 |
| B0 | 0 | | 17 |

TABLE II
A DIMENSION TABLE

| Ai | n(Ai) or SA | BAi | Map Order |
|---|---|---|---|
| A4 | 2 | D4, B11 | 6 |
| A5 | 1 | B26 | 9 |
| A6 | 1 | B6 | 10 |
| A10 | 1 | B11 | 11 |
| A13 | 1 | B10 | 12 |
| A14 | 1 | B5 | 13 |
| A16 | 1 | B17 | 14 |
| A17 | 1 | B27 | 15 |
| A18 | 1 | B27 | 16 |
| A19 | 1 | B27 | 17 |
| A20 | 1 | B6 | 18 |
| A23 | 1 | B11 | 19 |
| A25 | 2 | B4, B7 | 7 |
| A27 | 4 | B19, B20, B21, B22 | 1 |
| A30 | 4 | B4, B17, B18, B19 | 2 |
| A35 | 3 | B4, B6, B18 | 3 |
| A36 | 2 | B15, B23 | 8 |
| A29 | 3 | B17, B18, B19 | 4 |
| A31 | 3 | B17, B18, B19 | 5 |
| A0 | 0 | | 20 |

TABLE III
FAULT PROM

| Address (Mod 64) | Defective Address | Binary Data |
|---|---|---|
| 0,0 | A35, B4 | 1 000 0001 |
| 0,1 | A16, B17 | 0 000 0111 |
| 0,2 | A35, B18 | 1 000 0001 |
| 0,3 | A27, B19 | 1 000 0000 |
| 0,4 | A35, B6 | 1 000 0001 |
| 0,5 | A10, B11 | 1 000 0100 |
| 0,6 | A17, B27 | 1 000 1000 |
| 0,7 | A14, B5 | 1 000 0110 |
| 0,8 | | 0 |
| 0,9 | A13, B10 | 1 000 0101 |
| 0,10 | A36, B15 | 1 000 0010 |
| 0,11 | A27, B20 | 1 000 0000 |
| 0,12 | A27, B21 | 1 000 0000 |
| 0,13 | A27, B22 | 1 000 0000 |
| 0,14 | A36, B23 | 1 000 0010 |
| 0,15 | A5, B26 | 1 000 0011 |
| 0,16 | | 0 |
| ... | | |
| 0,63 | | 0 |
| 1,0 | A30, B4 | 1 000 0000 |
| 1,1 | A30, B17 | 1 000 0000 |
| 1,2 | A30, B18 | 1 000 0000 |
| 1,3 | A30, B19 | 1 000 0000 |
| 1,4 | A6, B6 | 1 000 0001 |
| 1,5 | A23, B11 | 1 000 0011 |
| 1,6 | A185, B27 | 1 000 0010 |
| 1,7 | | 0 |
| 1,8 | | 0 |
| 1,9 | | 0 |
| 1,10 | | 0 |
| ... | | |
| 1,63 | | 0 |
| 2,0 | A4, B4 | 1 000 0001 |
| 2,1 | A29, B17 | 1 000 0000 |
| 2,2 | A29, B18 | 1 000 0000 |
| 2,3 | A29, B19 | 1 000 0000 |
| 2,4 | A20, B6 | 1 000 0011 |
| 2,5 | A4, B11 | 1 000 0001 |
| 2,6 | A19, B27 | 1 000 0010 |
| 2,7 | | 0 |
| ... | | ... |
| 2,63 | | 0 |
| 3,0 | A25, B4 | 1 000 0001 |
| 3,1 | A31, B17 | 1 000 0000 |
| 3,2 | A31, B18 | 1 000 0000 |
| 3,3 | A31, B19 | 1 000 0000 |
| 3,4 | | 0 |
| 3,5 | | 0 |
| 3,6 | | 0 |
| 3,7 | | 0 |
| 3,8 | A25, B7 | 1 000 0001 |
| 3,9 | | 0 |
| ... | | |
| 3,63 | | 1 |
| ... | | |
| 63.63 | | 1 |

TABLE IV
PROGRAM DEFINITIONS

| | |
|---|---|
| A. FREQ. DAT | A file having stored at each record an A line no. corresponding thereto, the total number of fault locations on the A line, SA, and all of the B line intersections at fault locations, BA(J). |
| B. FREQ. DAT | A file having stored at each record a B line no. corresponding thereto, the total number of fault locations on the B line, SB, and all of the A line intersections at fault locations, AB(J). |
| ASEQ DAT | A listing of all A lines in the order of most faults to least faults. |
| DSEQ DAT | A listing of all B lines in the order of most faults to least faults. |
| FPAC(I) | A linked list of AT columns (AC) in order of least available fault states to most available fault states. Address 64 (NAC) points to the head of the list, with a |

TABLE IV-continued

| | |
|---|---|
| | sequential pointing to the tail which points to address 64. Initialized with AT0 at the head and AT63 at the tail. |
| IPAC | A current pointer to FPAC(I). |
| PPAC | Most recent past pointer to FPAC(I). |
| FPBC(J) | A linked list of BT columns (BC) in order of most available fault states to least available fault states. Address 64 (NBC) points to the head of the list, with a sequential pointing to the tail, which points to address 64. Initialized with BT0 at the head and BT63 at the tail. |
| IPBC | A current pointer to FPBC(I). |
| PPBC | Most recent past pointer to FPBC(I). |
| IAR(J) | Next available assignable AK key state for a given AT column. Initialized at 0 for each of 64 AT columns. |
| IBR(J) | Next available assignable BK key state for a given BT column. Initialized at 0 for each of 64 BT columns. |
| MAC(J) | Number of available unassigned vacancies for receiving fault states for a given AT column. Initialized at 64 for each of 64 AT columns. |
| MBC(J) | Number of available unassigned vacancies for receiving fault states for a given BT column. Initialized at 64 for each of 64 AT columns. |
| A ROW FILE | A file that is addressable by an A line number and contains the assigned AK row location in the A map (FIG. 9) for each A line number. Stores the data to be "burned" into A key PROM 40. |
| A COL FILE | A file that is addressable by an A line number and contains the assigned AT column location in the A map (FIG. 9) for each A line number. Stores the data to be "burned" into A translation PROM 42. |
| B ROW FILE | A file that is addressable by a B line number and contains the assigned BK row locations in the B map (FIG. 8) for each B line number. Stores the data to be "burned" into B key PROM 46. |
| B COL FILE | A file that is addressable by a B line number and contains the assigned BT column locations in the B map (FIG. 8) for each B line number. Stores the data to be "burned" into B translation PROM 44. |
| TA(I,J) | A two dimensional table corresponding to FIG. 9 and storing the assigned A line numbers at assigned address location AK, AT. Initialized at $-1$ to indicate empty spaces. |
| TB(I,J) | A two dimensional table corresponding to FIG. 8 and storing the assigned D line numbers at assigned address location BK,BT. |
| F(BC,AC) | Initialized at $-1$ to indicate empty spaces. A fault detect array having addresses corresponding to the address locations in fault PROM 48 and target storage module 26. Initially stores the indications of defective word locations in target storage module 26 and set to zero at each address corresponding to a defect. Initialized at $-1$ otherwise. By end of program it stores at each BT,AT translation address a 1 indicating translation address, 3 DK key bits and 4 AK key bits. Other address locations are set to zero for PROMs having a manufactured state of all zeros. |

FAULT DETECT

| | |
|---|---|
| FILE - | A file storing the contents of F(BC,AC). |
| STAT. | A statistics file that is peripheral to the program algorithm and stores statistics of interest. |
| ADDR.U. | An error address file containing the input address number of all locations within storage module 23 which are defective. |
| NERR | Current No. of errors. |
| NA | No. of AI input address lines (1024). |
| NB | No. of BI input address lines (512). |
| NAT | No. of AT columns (64). |
| NBT | No. of BT columns (64). |
| NX | No. of defective address locations in target storage module 26. |
| LAC(J) | Maximum no. of default states that may be assumed to a given AT column, AC(J). (64) |
| LBC(I) | Maximum no. of fault states that may be assigned to a given BT column, BC(I). (64) |
| MAC(J) | Current no. of unassigned fault states in AT column J. Initially LAC(J). |
| MBC(J) | Current no. of unassigned fault states in BT column J. Initially LBC(J). |
| IAR(J) | Next AK row state to be assigned in AT column J. Initially O. |
| IBR(J) | Next BK row state to be assigned in BT column J. Initially O. |
| NT | No. of addresses being translated. |
| NAR | No. of AK rows in A map (16). |
| NBR | No. of BK rows in B map (8). |
| SA(I) | No. of fault addresses on an input A line no. I. |
| SB(I) | No. of fault addresses on an input B line no. I. |
| QA(I) | A table listing the no. of errors SA on each input AI line no. I |
| QB(I) | A table listing the no. of errors SB on each input BI line no. I. |
| ERR.IN2 DAT | An input file listing the defective address locations in target storage module 26. |
| IB | B input line number BI. |

TABLE V

```
5    REM - ADDRESS TRANSLATION (PHASE 1)
10   REM - PROGRAM TO GENERATE WORKING FILES
20   LET Z1=SPC (2)
30   LET Z2=SPC (3)
50   DIM 1%,T1[63],Q[511],A1[63]
60   READ N1,N2,N4,N5
100  OPEN #1,"1/ADDR.U"
110  OPEN #2,"1/B.FREQ.DAT"
112  OPEN #3,"1/ERR.IN2.DAT"
120  IF ERR 0 GOTO 290
130  LET I=0
140  READ #1;B,A
150  LET S=0
160  IF B≠I GOTO 210
165  IF S≧N4 GOTO 8000
170  LET A1[S]=A
180  LET S=S+1
190  READ #1;B,A
200  GOTO 160
210  IF S>N4 GOTO 8000
220  RITE #2,1,O;I,S
230  MAT WRITE #2,-2,4;A1
240  LET I=I+1
```

TABLE V-continued

```
250     IF I<N2 GOTO 150
265     LET H=(B−N2)*1024+A
270     LET C2=INT (H/N4)
275     LET C1=H−(C2*N4)
280     WRITE #3;C2,C1
282     READ #1;B,A
285     GOTO 265
290     IF SPC (8)≠52 GOTO 9000
292     IF ERR 0 GOTO 9000
295     IF SPC (10)=282 GOTO 370
300     IF S>N4 GOTO 8000
310     WRITE #2,I,0;I,S
320     MAT WRITE #2,−2,4;A1
330     LET S=0
340     FOR J=I+1 TO N2−1
350     WRITE #2,J,0;J,S
360     NEXT J
370     CLOSE #1,#2,#3
380     PRINT "*** B FREQ TABLE COMPLETED ***"
390     REM - GENERATE A FREQ TABLE
400     OPEN #1,"1/ADDR.U"
410     OPEN #3,"1/A.FREQ.DAT"
430     LET T=0
432     FOR I=0 TO N5−1
434     LET T1[I]=0
436     NEXT I
440     FOR I=0 TO N1−1
450     WRITE #3,I;I,T
460     MAT WRITE #3,−2,4;T1
470     NEXT I
490     IF ERR 0 GOTO 600
500     READ #1;B,A
505     IF B≧N2 GOTO 500
510     READ #3,A,2;S
511     IF S≧N5 GOTO 8000
512     MAT READ #3,−2,4;T1
514     LET T1[S]=B
516     LET S=S+1
520     WRITE #3,−2,2;S
530     MAT WRITE #3,−2,4;T1
540     GOTO 500
600     IF SPC (8)≠52 GOTO 9000
605     IF ERR 0
610     CLOSE #1,#3
612     PRINT "*** A FREQ TABLE COMPLETED ***"
1980    REM - GENERATE B SORTED SEQUENCE
1985    OPEN #2,"1/B.FREQ.DAT"
1990    OPEN #4,"1/BSEQ.DAT"
2000    FOR I=0 TO N2−1
2010    READ #2,I,2;Q[I]
2020    NEXT I
2030    LET R=N2−1
2040    LET E=0
2050    LET I=N2−1
2060    IF Q[I]≠E GOTO 2100
2070    WRITE #4,R,0;I
2080    LET R=R−1
2090    IF R<0 GOTO 2200
2100    LET I=I−1
2110    IF I≧0 GOTO 2060
2120    LET E=E+1
2130    GOTO 2050
2200    CLOSE #2,#4
2210    LET C=1
2300    GOTO 9900
3000    DATA 1024,512,64,64
8000    PRINT "*TOO MANY ERRORS IN A SINGLE LINE*"
8010    GOTO 9900
9000    PRINT "*ERROR=" SPC (8)
9900    PRINT "* TIME ELAPSED (IN SEC) =" ( SPC (2)−Z1)
        *3600+(( SPC (3)−Z2)/10)
9910    IF C=1 CHAIN "1/ADTRAN2"
9920    END
10      REM - ADDRESS TRANSLATION (PHASE 2)
15      LET Z1=SPC (2)
16      LET Z2=SPC (3)
20      DIM I%,M2[63],R2[63]
22      DIM Q[1023]
30      DIM T2[7,63],L2[63],P6[64],A11[63]
40      DIM A2[63],E1[63]
50      PRINT "*** ADDRESS TRANSLATION -- STAGE 2 ***"
60      READ N1,N2,N3,N4,N5,N6
```

TABLE V-continued

```
100   REM DECISION TABLE INITIALIZATION
110   OPEN #2,"1/ERR.IN2.DAT"
180   FOR J=0 TO N4-1
190   LET L2[J]=N3
200   FOR I=0 TO N6-1
210   LET T2[I,J]=-1
220   NEXT I
230   NEXT J
240   IF ERR 0 GOTO 350
300   READ #2;C2,C1
320   LET L2[C2]=L2[C2]-1
340   GOTO 300
350   IF SPC (8)≠52 GOTO 9100
360   IF ERR 0 GOTO 9100
370   CLOSE #2
380   PRINT "*** INITIALIZE LINKED LIST ***"
390   REM
400   FOR I=0 TO N4-1
410   LET M2[I]=L2[I]
420   NEXT I
500   REM - SORT BC LINKED LIST IN DESENDING ORDER OF M2(I)
510   LET P5=N4
520   LET I1=N3
530   LET I=0
540   IF M2[I]≠I1 GOTO 580
550   LET P6[P5]=I
560   LET P5=I
580   LET I=I+1
590   IF I<N4 GOTO 540
600   LET I1=I1-1
610   IF I1≧=0 GOTO 530
620   LET P6[P5]=N4
830   REM - INITIALIZE ROW NOS.
840   FOR I=0 TO N4-1
850   LET R2[I]=0
860   NEXT I
910   PRINT "*** ROW/COLUMN ALLOCATION BEGINS ***"
1000  REM - ROW , COLUMN ALLOCATION
1005  PRINT "B","BC","BR","N(BC)","SB"
1010  OPEN #3,"1/B.FREQ.DAT"
1030  OPEN #5,"1/BSEQ.DAT"
1035  FOR X=0 TO N2-1
1040  READ #5,X;B
1050  READ #3,B,2;S2
1060  REM - ASSIGN B
1070  MAT READ #3,-2,4;A1
1100  LET P4=N4
1110  LET P5=P4
1120  LET P4=P6[P4]
1130  IF P4≧N4 GOTO 7000
1190  IF M2[P4]<S2 GOTO 1110
1200  IF R2[P4]≧N6 GOTO 1110
1204  FOR I=0 TO N4-1
1208  LET E=T2[I,P4]
1210  IF E=-1 GOTO 1300
1212  READ #3,E,2;S3
1214  MAT READ #3,-2,4;A2
1216  J1=0 TO S2-1
1232  FOR K1=0 TO S3-1
1234  IF A1[J]=A2[K1] GOTO 1110
1236  NEXT K1
1280  NEXT J1
1290  NEXT I
1300  REM - CONFIRM B ASSIGNMENT
1810  LET R4=R2[P4]
1820  LET T2[R4,P4]=B
1840  LET R2[P4]=R2[P4]+1
1850  LET M2[P4]=M2[P4]-S2
1852  PRINT B,P4,R4,M2[P4],S2
1860  LET P7=P4
1870  LET I=P6[P4]
1880  IF I=N4 GOTO 1920
1890  IF M2[P4]≧M2[I] GOTO 1920
1900  LET P7=I
1910  LET I=P6[I]
1915  GOTO 1880
1920  IF P7=P4 GOTO 2020
1922  LET P6[P5]=P6[P4]
1925  LET P6[P7]=P4
1930  LET P6[P4]=I
2020  NEXT X
2200  CLOSE #3,#5
```

TABLE V-continued

```
2210  REM - WRITE PROM FILES
2212  PRINT "*** WRITE PROM FILES ***"
2240  OPEN #1,"1/B.ROW"
2250  OPEN #2,"1/B.COL"
2330  FOR I=0 TO N6-1
2340  FOR J=0 TO N4-1
2350  WRITE #1,T2[I,J];I
2360  WRITE #2,T2[I,J];J
2370  NEXT J
2380  NEXT I
3000  CLOSE #1,#2
3990  REM - GENERATE A SEQUENCE TABLE
4000  OPEN #7,"1/ASEQ.DAT"
4005  OPEN #4,"1/A.FREQ.DAT"
4010  FOR I=0 TO N1-1
4020  READ #4,I,2;Q[I]
4030  NEXT I
4040  LET R=N1-1
4050  LET E=0
4060  LET I=N1-1
4070  IF Q[I]≠E GOTO 4110
4080  WRITE #7,R;I
4090  LET R=R-1
4100  IF R<0 GOTO 4200
4110  LET I=I-1
4120  IF I≧0 GOTO 4070
4130  LET E=E+1
4140  GOTO 4060
4200  CLOSE #4,#7
4210  LET C=1
4300  GOTO 9900
7000  REM - DEASSIGN PREVIOUS B
7001  IF S5=0 GOTO 7005
7002  FOR I=0 TO S5-1
7003  IF E1[I]=B GOTO 7008
7004  NEXT I
7005  IF S5=64 GOTO 8000
7006  LET E1[S5]=B
7007  LET S5=S5+1
7008  IF X=0 GOTO 8000
7010  LET X1=X-1
7020  READ #5,X1;D
7025  READ #3,D,2;S4
7027  PRINT "* ASSIGNMENT FAILED IN B=";B,"; DEASSIGN B=";D
7030  FOR I=N6=1 TO 0 STEP -1
7040  LET P4=N4
7042  LET P5=P4
7044  LET P4=P6[P4]
7046  IF P4=N4 GOTO 7070
7050  IF T2[I,P4]=D GOTO 7080
7060  GOTO 7042
7070  NEXT I
7080  LET T2[I,P4]=-1
7085  LET R2[P4]=R2[P4]-1
7090  LET M2[P4]=M2[P4]+S4
7100  REM - RE-SORT BC LINKED LIST
7110  LET P7=N4
7120  LET I=P6[N4]
7130  IF I=P4 GOTO 7300
7140  IF M2[P4]≧M2[I]GOTO 7180
7150  LET P7=I
7160  LET I=P6[I]
7170  GOTO 7130
7180  LET P6[P5]=P6[P4]
7190  LET P6[P7]=P4
7200  LET P6[P4]=I
7300  REM - INTERCHANGE ORDER IN "BSEQ.DAT"
7310  WRITE #5,X1;B
7320  WRITE #5,X;D
7330  LET X=X-1
7331  IF S5=0 GOTO 1040
7332  FOR I=0 TO S5-1
7334  IF E1[I]=D GOTO 7008
7335  NEXT I
7340  GOTO 1040
8000  PRINT "* B ASSIGNMENT FAILED !!"
8010  PRINT "M2(I)="
8020  FOR I=0 TO N4-1
8030  PRINT M1[I]
8040  NEXT I
8050  PRINT "T2(I,J)="
8060  FOR I=0 TO N6-1
```

TABLE V-continued

```
8070    FOR J=0 TO N4-1
8080    PRINT T2[I,J];
8090    NEXT J
8100    NEXT I
8200    GOTO 9900
9000    REM ERROR HANDLING ROUTINE
9100    PRINT "* ERROR =" SPC (8)
9110    PRINT "IN LINE" SPC (10)
9800    DATA 1024,512,64,64,16,8
9900    PRINT "* TIME ELAPSED =" (SPC (2)-Z1)*3600+(( SPC
        (3)-Z2)/10)
9910    IF C=1 CHAIN "1/ADTRAN3"
9920    END
10      REM - ADDRESS TRANSLATION (PHASE 3)
15      LET Z1=SPC (2)
16      LET Z2=SPC (3)
20      DIM 1%,M1[63],R1[63],F1[63,63]
30      DIM T1[15,63],L1[63],P3[64],B1[63],D1[63]
40      DIM B2[63],E1[63]
50      PRINT "*** ADDRESS TRANSLATION - STAGE 3 ***"
60      READ N1,N2,N3,N4,N5,N6,N7
100     REM DECISION TABLE INITIALIZATION
110     OPEN #2,"1/ERR.IN2.DAT"
120     FOR J=0 TO N3-1
130     LET L1[J]=N4
140     FOR I=0 TO N5-1
150     LET T1[I,J]=-1
160     NEXT I
170     NEXT J
240     IF ERR 0 GOTO 350
300     READ #2;C2,C1
310     LET F1[C2,C1]=-1
330     LET L1[C1]=L1[C1]-1
340     GOTO 300
350     IF SPC (8)≠52 GOTO 9100
360     IF ERR 0 GOTO 9100
370     CLOSE #2
380     PRINT "*** INITIALIZE LINKED LIST ***"
430     FOR I=0 TO N3-1
440     LET M1[I]=L1[I]
450     NEXT I
500     OPEN #6,"1/STAT"
510     READ #6,0,29;E7
520     CLOSE #6
530     IF E7≧N7 GOTO 700 ! #ERRORS ≧N7 ?
600     REM - INITIALIZE UNSORTED AC LINKED LIST
610     LET P3[N3]=0
620     FOR I=0 TO N3-1
630     LET P3[I]=I+1
640     NEXT I
650     GOTO 830
700     REM - SORT AC LINKED LIST IN ASCENDING ORDER OF M1[I]
710     LET P2=N3
720     IET I1=N4
730     LET I=N3-1
740     IF M1[I]≠I1 GOTO 780
750     LET P3[I]=P2
755     LET P2=I
770     LET P3[N3]=I
780     LET I=I-
790     IF I≧0 GOTO 740
800     LET I1=I1-1
810     IF I1≧=0 GOTO 730
830     REM - INITIALIZE ROW NOS
880     FOR I=0 TO N3-1
890     LET R1[I]=0
900     NEXT I
910     PRINT "***A ROW/COLUMN ALLOCATION BEGINS ***"
1000    REM - A ASSIGNMENT
1005    PRINT "A","AC","AR","N(AC)","SA","BC"
1010    OPEN #1,"1/B.ROW"
1015    OPEN #2,"1/B.COL"
1020    OPEN #4,"1/A.FREQ.DAT"
1030    OPEN #5,"1/ASEQ.DAT"
1035    FOR X=0 TO N1-1
1040    READ #5,X;A
1050    READ #4,A,2;S1
1070    READ #4,-2,4;B1
1100    LET P1=N3
1110    LET P2=P1
1120    LET P1=P3[P1]
1130    IF P1≧N3 GOTO 7000
```

TABLE V-continued

```
1190  IF M1[P1]<S1 GOTO 1110
1200  IF R1[P1]≧N5 GOTO 1110
1300  REM - CHECK FOR CONFLICT
1310  FOR J=0 TO S1-1
1320  READ #2,B1[J];B2[J]
1400  LET P4=B2[J]
1450  IF F1[P4,P1]≠0 GOTO 1110
1470  NEXT J
1490  REM - CONFIRM A ASSIGNMENT
1500  LET R3=R1[P1]
1510  LET T1[R3,P1]=A
1600  FOR J=0 TO S1-1
1602  LET P4=B2[J]
1610  READ #1,B1[J];R4
1620  LET F1[P4,P1]=R4*16+R3+128
1636  NEXT J
1640  LET R1[P1]=R1[P1]+1
1650  LET M1[P1]=M1[P1]-1
1652  PRINT A,P1,R3,M1[P1],S1,P4
1655  IF E7<N7 GOTO 1940 ! DONT SORT AC LINKED LIST IF
      #ERR<N7
1660  LET P7=N3
1670  LET I=P3[N3]
1680  IF I=P1 GOTO 1940
1690  IF M1[P1]≧M1[I] GOTO 1720
1700  LET P7=I
1710  LET I=P3[I]
1715  GOTO 1680
1720  LET P3[P2]=P3[P1]
1725  LET P3[P7]=P1
1730  LET P3[P1]=I
1940  NEXT X
2200  CLOSE #1,#2,#4,#5
2210  REM - WRITE PROM FILES
2212  PRINT "*** WRITE PROM FILES ***"
2220  OPEN #1,"1/A.ROW"
2230  OPEN #2,"1/A.COL"
2240  OPEN #3,"1/FAULT.DETECT"
2250  OPEN #4,"1/STAT"
2270  FOR I=0 TO N5-1
2280  FOR J=0 TO N3-1
2290  WRITE #1,T1[I,J];I
2300  WRITE #2,T1[I,J];J
2310  NEXT J
2320  NEXT I
2400  FOR J=0 TO N3-1
2410  FOR I=0 TO N4-1
2420  IF F1[I,J]=-1 LET F1[I,J]=0
2430  WRITE #3;F1[I,J]
2440  NEXT I
2450  NEXT J
2490  REM - UPDATE FROM BURNING AND ADRESS TRANSLATION
      SCHEME CONTROL WORD
2500  LET J=1
2510  FOR I=32 TO 36
2520  WRITE #4,0,I;J
2530  NEXT I
2540  FOR I=0 TO N3*N4-1
2545  READ #3,I;F
2550  IF F=0 GOTO 2570 ! UNBURNED STATE =0
2555  LET I1=INT (I/N2)
2560  WRITE #4,0,I1+37;J
2565  LET I=I1*N2+N2-1
2570  NEXT I
2580  LET J=3 ! 4K ADDRESS SCHEME
2590  WRITE #4,0,46;J
3000  CLOSE #1,#2,#3,#4
4000  PRINT "*** ALLOCATION COMPLETED ***"
4010  LET C=1
4100  GOTO 9900
7000  REM - DEASSIGN PREVIOUS A
7001  IF S5=0 GOTO 7005
7002  FOR I=0 TO S5-1
7003  IF E1[I]=A GOTO 7008
7004  NEXT I
7005  IF S5=64 GOTO 8000
7006  LET E1[S5]=A
7007  LET S5=S5+1
7008  IF X=0 GOTO 8000
7010  LET X1=X-1
7020  READ #5,X1;D
7025  READ #4,D,2;S4
```

TABLE V-continued

```
7026 MAT READ #4,-2,4;D1
7027 PRINT "*ASSIGNMENT FAILED IN A="A,"; DEASSIGN A="D
7030 FOR I=N5-1 TO 0 STEP -1
7040 LET P1=N3
7042 LET P2=P1
7044 LET P1=P3[P1]
7046 IF P1=N3 GOTO 7070
7050 IF T1[I,P1]=D GOTO 7080
7060 GOTO 7042
7070 NEXT I
7075 PRINT "* ERROR IN PREVIOUS A ASSIGNMENT *"
7077 GOTO 8000
7080 LET T1[I,P1]=-1
7085 LET R1[P2]=R1[P1]-1
7090 LET M1[P1]=M1[P1]+S4
7092 FOR J=0 TO S4-1
7094 READ #2,D1[J];P4
7096 LET F1[P4,P1]=255
7098 NEXT J
7100 REM - RE-SORT AC LINKED LIST
7110 LET P7=P1
7120 LET I=P3[P1]
7130 IF I=N3 GOTO 7180
7140 IF M1[P1]≧M1[I] GOTO 7180
7150 LET P7=I
7160 LET I=P3[I]
7170 GOTO 7130
7180 IF P7=P1 GOTO 7300
7190 LET P3[P2]=P3[P1]
7200 LET P3[P7]=P1
7210 LET P3[P1]=I
7300 REM - INTERCHANGE ORDER IN "ASEQ.DAT"
7310 WRITE #5,X1;A
7320 WRITE #5,X;D
7330 LET X=X-1
7331 IF S5=0 GOTO 1040
7332 FOR I=0 TO S5-1
7334 IF E1[I]=D GOTO 7008
7335 NEXT I
7336 GOTO 1040
8000 PRINT
8010 PRINT "*ALLOCATION FAILURE*"
8020 PRINT "M1(I)=";
8022 FOR I=0 TO N3-1
8023 PRINT M1[I];
8024 NEXT I
8032 PRINT
8034 PRINT "F1(I,J):"
8035 FOR I=0 TO N4-1
8036 FOR J=0 TO N3-1
8037 PRINT F1[I,J];
8038 NEXT J
8039 NEXT I
8040 PRINT
8041 PRINT "T1(I,J):"
8042 FOR I=0 TO N5-1
8043 FOR J=0 TO N3-1
8044 PRINT T1[I,J];
8045 NEXT J
8046 NEXT I
8050 PRINT
8100 GOTO 9900
9100 PRINT "*ERROR=" SPC (8)
9110 PRINT "IN LINE" SPC (10)
9800 DATA 1024,512,64,64,.16,8,2300
9900 PRINT
9902 PRINT "* TIME ELAPSED ="(SPC (2)-Z1)*3600+(( SPC
     (3)-Z2)/10)
9910 IF C=1 CHAIN "1/CLOSE.PH2"
9920 END
```

TABLE VI

TERMS USED IN TABLE V

| | |
|---|---|
| N1 | NA 1024 |
| N2 | NB 512 |
| N3 | NAT 64 |
| N4 | NBT 64 |
| N5 | NAR 16 |
| N6 | NBR 8 |
| N7 | No. of defective addresses below which |
| | FPAC(I) linked list will not be updated (2300) |
| s | SB |
| S4 | SD No. of errors on A line be de-assigned |
| S5 | No. of de-assigned A lines |
| Z1 | Initial time value at start of program execution Adtran II |
| Z2 | Initial time value at start of program |

TABLE VI-continued
TERMS USED IN TABLE V

| | |
|---|---|
| | execution Adtran III |
| SPC | Special IRIS function |
| SPC(8) | Provides error No. for an error message |
| A | Input A line No. |
| B | Input B line No. |
| T,R,E,H | |
| I,J | Temporary variables |
| A1 | AB(I) |
| A2 | BA(I) |
| T1 | Table TA(I,T) |
| T2 | Table TB(I,J) |
| Q(I) | No. of errors on each B input line |
| R1 | IAR(J) |
| R2 | IBR(J) |
| R3 | AR |
| R4 | BR |
| R | Temporary record No. for sorting file BSEQ DAT |
| L1 | LAC(I) 64 |
| L2 | LAC(I) 64 |
| M1 | MAC(I) |
| M2 | MBC(I) |
| E | No. of errors in B line |
| E1(I) | A lines previously deassigned and not yet re-assigned |
| E7 | Total No. of errors in 516K storage module 23 |
| P1 | PPAC |
| P2 | IPAC |
| P3 | FPAC(I) linked list |
| P4 | IPBC |
| P5 | PPBC |
| P6 | FPBC(I) linked list |
| F1 | F(BC,AC) |
| B1(I) | |
| B2(I) | |
| D | Temporary variable for de-assigned A line No. |
| D1(I) | B lines associated with deleted A line No. |
| C1 | AT address |
| C2 | BT address |

What is claimed is:

1. A computer program for assigning data states to stores defining mapping relationships in a mapping system mapping input states to output states and which assigns each input state to an A superstate within an A group of superstates and to a B superstate within a B group of superstates, each superstate including a plurality of input states, the computer program comprising the steps of:

assigning in succession a plurality of B superstates, each having at least one input state which is to be mapped included therein, to a BK by BT B map having a plurality of BK states and a plurality of BT states orthogonal to and intersecting each of the BK states with not more than a predetermined maximum number of input states to be mapped being assignable to any given BT state, the B superstates being assigned to the B map with at most one B superstate assigned to any given Bk, BT intersection and being preferentially assigned to a BT state having a greatest number of vacancies available to receive input states to be mapped; and assigning in succession a plurality of A superstates, each having at least one input state which is to be mapped included therein, to an AK by AT A map having a plurality of AK states and a plurality of AT states orthogonal to and intersecting each of the AK states with not more than a predetermined maximum number of input states to be mapped being assignable to any given AT state, the A superstates being assigned to the A map with at most one A superstate assigned to any given Ak, AT intersection and with each successive A superstate being preferentially assigned to an AT state having the smallest number of vacancies available to receive input states which are to be mapped.

2. The program according to claim 1 above, wherein each B superstate is assigned to the B map in sequential order of the number of states to be mapped included therein from most to least.

3. The program according to claim 1 or 2 above, wherein each A superstate is assigned to the A map in sequential order of the number of states to be mapped included therein from most to least.

4. The program according to claim 1 or 2 above, wherein the predetermined maximum number of input states to be mapped to any given BT state is the number of AT states in the A map.

5. The program according to claim 1 or 2 above, wherein the predetermined maximum number of input states to be mapped to any given AT state is the number of BT states in the B map.

6. A digital computer program for assigning translation data and key states to data stores in a mapping system in which encoded input signals are divided into a plurality of groups with each group having a plurality of superstates with each superstate partially defining a plurality of input states of the input signals, selected ones of the input states being mapped states which are to be mapped by the mapping system and in which each superstate that partially defines a mapped state is assigned a translation state partially defining an output map state and a key state such that each assigned superstate is uniquely identified by a translation state and a key state, the digital computer program comprising the steps of:

sequentially ordering the superstates of each group to form a group superstate sequential order in accordance with the number of mapped states associated with each superstate in the group;

sequentially ordering the translation states for each group according to a selected sequence that is dependent upon a number of mapped states assigned to each translation state;

selecting superstates from the groups of superstates in a selected order which is constrained by a requirement that within a group the superstates be selected in the group superstate sequential order therefor, and in order that each given superstate is selected;

assigning the given superstate to a translation state for the same group as the superstate preferentially in the order of the selected sequence therefor; and assigning the given superstate to a key state for the same group as the superstate, the assigned key state uniquely identifying the superstate among all other superstates in the same group which are assigned to the same translation state.

7. The program according to claim 6 above, further comprising the steps of updating the sequential order of the translation states of a selected group each time a superstate is assigned to a translation state of the selected group.

8. The program according to claim 6 or 7 above comprising the steps of sequentially ordering the groups according to the number of superstates therein from least to most to form a group sequential order and selecting the groups in the group sequential order with all of the superstates in a selected group which partially define a mapped state being assigned to translation and key states before a next group is selected.

9. The method of assigning translation and key states to A and B mapping states in a mapping system in which mapped states representing input states which are to be mapped are each assigned to a superstate within an A group of superstates and to a superstate within a B group of superstates, the method comprising the steps of:

generating a list of A group superstates in sequential order of the number of mapped states assigned thereto from most to least;

generating a list of B group superstates in sequential order of the number of mapped states assigned thereto from most to least;

sequentially ordering a plurality of B translation states each having a capacity for the assignment of a predetermined maximum number of mapped states thereto, according to a number of vacancies that are available for assignment of mapped states thereto;

selecting a next B group superstate from the list of B group superstates in sequential order;

testing for an availability of vacancies in the selected highest ordered B translation state for assignment of additional mapped states thereto and for any conflict between the selected B group superstate and any previously assigned superstate;

selecting a next sequentially ordered B translation state if one of the tests fails and repeating the testing step;

assigning the selected B group superstate to the selected B translation state if none of the tests fails;

interchanging a currently selected B group superstate with a previously correlated B group superstate and repeating the selecting a next B group superstate, selecting a highest ordered B translation state, testing and selecting a next sequentially ordered B translation state steps when all B translation states have been unsuccessfully tested;

generating an array storing the assignment of B group superstates to B translation states;

after all B group superstates have been assigned to a B translation state, sequentially ordering a plurality of A translation superstates each having a capacity for the assignment of a predetermined maximum number of mapped states thereto, according to a number of vacancies that are available for assignment of mapped states thereto;

selecting a next A group superstate in sequential order;

selecting a highest ordered A translation state;

testing for availability of vacancies in the highest ordered A translation state for assignment of additional mapped states thereto and for any conflicts between the selected A group superstate and any previously assigned superstate;

selecting a next sequentially ordered A translation state if one of the tests fails and repeating the testing step;

assigning the selected B group superstate to the selected B translation state if none of the tests fails;

interchanging a currently selected A group superstate with a previously selected A group superstate and repeating the A group related steps of selecting a next A group superstate, selecting a highest ordered A translation state, testing and selecting a next sequentially ordered A translation state when all A translation states have been unsuccessfully tested; and generating an array storing the assignment of A group superstates to A translation states.

10. The method according to claim 9 above, wherein the B translation states are sequentially ordered from least to most number of vacancies that are available.

11. The method according to claim 9 above, wherein the A translation states are sequentially ordered from least to most number of vacancies that are available.

12. The method according to claim 9 above, wherein the A translation states and B translation states are both sequentially ordered from most to least number of vacancies available for receiving mapped states.

13. The method according to claim 9 above, further comprising the steps of storing each B translation state in a B translation memory for the mapping system with each B superstate defining a different address location in the B translation memory and with each B translation state being stored at the address defined by each B group superstate assigned to the translation state and storing each A translation state in an A translation memory for the mapping system with each A superstate defining a different address location in the A translation memory and with each A translation state being stored at the address defined by each A group superstate assigned to the B translation state.

* * * * *

UNITED STATES PATENT AND TRADEMARK OFFICE
CERTIFICATE OF CORRECTION

PATENT NO. : 4,435,754
DATED : March 6, 1984
INVENTOR(S) : Yiu T. Chow and Thomas J. Gilligan It is certified that error appears in the above-identified patent and that said Letters Patent is hereby corrected as shown below:

Column 10, Line 35, change "RPOM" to --PROM--.
Column 11, line 49, change "stoed" to --stored--.
Column 14, lines 42 and 43, change "cionsumed" to --consumed--.
Column 23, line 44, change "D27" to --B27--;
          line 51, change "D4" to --B4--.
Column 24, line 64, change "DSEQ" to --BSEQ--.
Column 25, line 46, change "D line" to --B line--.
Column 26, line 11, change "3 DK" to --3 BK--.
Column 33, line 6, change "REM ERROR" to --REM -- ERROR--;
          line 22, change "REM DECISION" to --REM -- DECISION--;
          line 55, change "IET" to --LET--;
          line 61, change "I=I-" to --I=I-1--;
          line 79, before "READ" insert --MAT--.
Column 35, line 18, change "-1" to -- -S1--.
Column 39, line 21, change "LAC" to --LBC--.

Signed and Sealed this

Fifteenth Day of October 1985

[SEAL]

Attest:

DONALD J. QUIGG

Attesting Officer

Commissioner of Patents and
Trademarks—Designate